United States Patent [19]

Hirai et al.

[11] Patent Number: 5,406,106
[45] Date of Patent: Apr. 11, 1995

[54] SEMICONDUCTOR BI-MIS DEVICE AND METHOD OF MANUFACTURING THE SAME

[75] Inventors: Takehiro Hirai, Osaka; Masahiro Nakatani, Ishikawa; Mitsuo Tanaka; Akihiro Kanda, both of Osaka, all of Japan

[73] Assignee: Matsushita Electric Industrial Co., Ltd., Osaka, Japan

[21] Appl. No.: 76,838

[22] Filed: Jun. 15, 1993

[30] Foreign Application Priority Data

Jun. 24, 1992 [JP] Japan ................... 4-165845

[51] Int. Cl.⁶ ............... H01L 27/02; H01L 29/68; H01L 27/04
[52] U.S. Cl. .................. 257/378; 257/316; 257/324; 257/370; 257/555; 257/627; 257/441
[58] Field of Search ................. 257/370, 378

[56] References Cited

U.S. PATENT DOCUMENTS 4,247,861 1/1981 Hsu et al. .................. 257/378
4,484,388 11/1984 Iwasaki ..................... 257/370
5,005,066 4/1991 Chen ........................ 257/370

FOREIGN PATENT DOCUMENTS 64-59952 3/1989 Japan .

*Primary Examiner*—Gene M. Munson
*Attorney, Agent, or Firm*—Willian Brinks Hofer Gilson & Lione

[57] ABSTRACT

A silicon oxide film as a dielectric film and a silicon nitride film or a polysilicon film as a protection film for the silicon oxide film are formed on a silicon substrate. After the two films are selectively etched to form contact holes of a bipolar transistor, a polysilicon film as a conductive film is laid on the entire substrate and selectively etched to form electrodes. In a MIS transistor, the protection film of the silicon nitride film serves as a gate insulator film and the protection film of the polysilicon film serves as a gate electrode. Accordingly, contamination to the gate insulator film at formation of contact holes of the bipolar transistor is prevented, and an excellent semiconductor with Bi-MOS structure is manufactured with low cost.

4 Claims, 25 Drawing Sheets

SEMICONDUCTOR BI-MIS DEVICE AND METHOD OF MANUFACTURING THE SAME

BACKGROUND OF THE INVENTION

This invention relates to a composite semiconductor device in which a bipolar transistor and a MIS transistor are formed on a semiconductor substrate and to a method of manufacturing the semiconductor.

There has been many semiconductor devices with Bi-CMOS structure proposed in which a bipolar transistor and a complementary MOS transistor (CMOS transistor) are integrally formed.

As a method of manufacturing a general semiconductor with Bi-CMOS structure, a method disclosed in Japanese Patent Application Laying Open Gazette No. 64-59952 is explained, with reference to FIGS. 23–25.

As shown in FIG. 23, an N+ buried layer 3 and a P+ buried layer 4 are formed on a P-type silicon substrate 1 and an N− type epitaxial layer 6 are formed thereon. After a P-well 6a is provided on the N− type epitaxial layer 6, a field insulator film 17f is formed on a part of the surface of the substrate according to a selective oxidization process so as to define a region Rbip where a bipolar transistor is to be formed, a region Rnmos where an NMOS transistor is to be formed, and a region Rpmos where a PMOS transistor is to be formed. A silicon oxide film 17 as a dielectric film is formed and a P− type active base region 11 of an NPN bipolar transistor is formed.

Then, as shown in FIG. 24, the silicon surface is exposed by etching the silicon oxide film 17 on the P− type active base region 11, using a resist as a mask or the like so as to make an emitter contact hole 19a. A polysilicon film 21 of 300 nm thickness is laid on the substrate according to a low pressure CVD method.

Next, as shown in FIG. 25, the polysilicon film 21 is etched using the resist as a mask to form an emitter polysilicon electrode 21a in the region Rbip where the bipolar transistor is to be formed, and to concurrently form gate polysilicon electrodes 21f in the region Rnmos where the NMOS transistor is to be formed and the region Rpmos where the PMOS transistor is to be formed. Then, implant and diffusion of arsenic ions are selectively conducted over the substrate to form an N+ emitter layer 23 of the NPN bipolar transistor and a source 14a and a drain 14b of an NMOSFET. At this time, the arsenic is also doped to a gate polysilicon electrode 21f of the NMOSFET. Further, implant and diffusion of boron ions are conducted to form a grafting base region 11a of the NPN bipolar transistor and a source 15a and a drain 15b of the PMOSFET. At this time, the boron is also doped to the gate polysilicon electrode 21f of the PMOSFET.

Thus manufactured is the semiconductor device with Bi-MOS structure.

The above semiconductor device and the method thereof, however, have following problems.

(1) The silicon oxide film 17 is contaminated by resist coating, etching, and the like, since the step of forming the contact holes such as the emitter diffusion hole 19a of the bipolar transistor is carried out after the step of forming the silicon oxide film 17 and before the step of laying the polysilicon film 21.

(2) It is required to conduct dip-etching for removing a natural oxide film on the N+ emitter layer 23 after the step of forming the emitter contact hole 19a and before the step of laying the polysilicon film 21. However, in conventional semiconductor device and method thereof, in case with the silicon oxide film 17 of about 10 nm thickness, such dip-etching reduces the thickness of the silicon oxide film 17 further, so that variation of the characteristic and deficiency due to pin holes are caused. This involves a problem in a MOSFET. In the bipolar transistor, since the silicon oxide film 17 is used as an insulator film between a subsurface silicon substrate and the polysilicon film 21 which serves as an emitter diffusion mask and an emitter electrode, deficiency in durability to high voltage between the emitter and the base and increase in leakage current are caused.

On the other hand, Japanese Patent Application Laying Open Gazette No. 3-148862 discloses a method in order to enhance the performance of a bipolar transistor, which is required accompanied by miniaturization of elements. The method is that: a silicon oxide film is formed as a gate insulator film on an entire substrate before the contact hole of the bipolar transistor is made; after a polysilicon film to be a part of a gate electrode is laid on the silicon oxide film and the polysilicon film on an active region of the bipolar transistor is removed by etching, a thick silicon oxide film is further laid thereon; the contact hole of the bipolar transistor is made at the same time as the silicon oxide film of the MOS transistor is removed; and a polysilicon film to be a part of the electrode of the bipolar transistor and the gate electrode of the MOS transistor is laid thereon. In this method, since the silicon oxide film of the gate electrode of the MOS transistor is covered with the polysilicon film at the formation of contact hole of the bipolar transistor, the contamination to the silicon oxide film can be lessened. However, the step of removing the polysilicon at the active region of the bipolar transistor is required beside the step of forming the contact hole of the bipolar transistor, which means increase in manufacturing steps. Therefore, the cost increases though the contamination to the gate insulator film is prevented.

The present invention has its object of providing a semiconductor device and a method of manufacturing a semiconductor device where the MIS transistor and the bipolar transistor formed on the semiconductor substrate which has high reliability without increase in manufacturing steps and cost by providing a protection means to the gate insulator film on the semiconductor substrate at the MIS transistor at the formation of contact hole on the active region of the bipolar transistor.

SUMMARY OF THE INVENTION

In the present invention, to attain the above object, a protection film serving as a gate insulator film or a gate electrode is provided between a dielectric film serving as the gate insulator film and a conductive film serving as the gate electrode on the semiconductor substrate.

In detail, a semiconductor device in which a MIS transistor and a bipolar transistor are arranged on a semiconductor substrate, comprises:
  a) the MIS transistor having:
    a dielectric film formed on the semiconductor substrate and serving as a gate insulator film;
    a protection film formed on the dielectric film for protecting the dielectric film by barring contamination matters from passing therethrough; and
    a conductive film formed on the protection film and serving as a gate electrode; and
  b) the bipolar transistor having;

a dielectric film and a protection film respectively formed at least on one of active regions of an emitter, a base and a collector of the semiconductor substrate, and respectively made of a same material as the dielectric film and the protection film of the MIS transistor;

a contact hole made by opening the dielectric film and the protection film at an upper part of the active region of the semiconductor substrate; and an electrode formed so as to cover at least a part of the protection film and an exposing face of the contact hole, and contacting to the active region.

As a method of manufacturing a semiconductor device in which a MIS transistor and a bipolar transistor are arranged on a semiconductor substrate, the method in the present invention comprises the steps of:

forming a dielectric film to be a gate insulator film of the MIS transistor on at least a region where the MIS transistor is to be formed and a region where the bipolar transistor is to be formed in the semiconductor substrate;

forming a protection film at least on the dielectric film;

forming a contact hole by selectively etching the dielectric film and the protection film to open an upper part of a region where at least one of active regions of an emitter, a collector and a base of the bipolar transistor is to be formed;

forming a conductive film for covering an exposing face of the protection film and the contact hole; and forming a gate electrode in a region where the MIS transistor is to be formed by patterning at least the conductive film, concurrently with formation of an electrode in the active region whose upper part is open in a region where the bipolar transistor is to be formed.

Accordingly, since the protection film which hardly passes contamination matters through is formed on the dielectric film serving as the gate insulator film of the MIS transistor, the dielectric film, especially the gate insulator film of the MIS transistor is prevented from contamination due to resist coating and etching for forming the contact hole of the bipolar transistor in the manufacturing process of the semiconductor device. The protection film serves as the insulator film or the electrode of the MIS transistor and the bipolar transistor, which requires no step of removing the protection film solely. In consequence, an excellent, cheap semiconductor device is obtained without increase in the number of steps and contamination to the gate insulator film due to the removal.

The protection film is made of an insulating material, and serves as a gate insulator film together with the dielectric film in the gate region of the MIS transistor.

As a result, the protection film serves as the gate insulator film of the MIS transistor. However, in addition to the effect of prevention of contamination, it is made possible to adequately adjust the characteristic of the gate insulator film according to a kind of semiconductor device by selecting the material of the protection film.

The dielectric film is a silicon oxide film, and the protection film is a silicon nitride film.

Accordingly, since contamination matters can hardly pass through the silicon nitride film which is the protection film with high density, the dielectric film is made cleaner. Also, the gate insulator film of the MIS transistor is composed of a two-layer film of the silicon oxide film and the silicon nitride film, i.e., ON film, the characteristic of the gate insulator film is enhanced.

The dielectric film is a very thin silicon oxide film, and a region around a boundary of the protection film and the dielectric film serves as a non volatile memory.

Accordingly, without increase in the number of masks and of steps required for manufacturing the bipolar transistor in the semiconductor manufacturing process, the semiconductor device with the MIS transistor which is an MNOS type non volatile memory is obtained. Namely, obtained is a low cost semiconductor device with the bipolar transistor and the MNOS type non volatile memory.

At least one of the protection film and the dielectric film is a multiple-layer film.

Since the gate insulator film is a multiple-layer film more than three layers of, for example, ONO structure (silicon oxide film-silicon nitride film-silicon oxide film), obtained is a semiconductor device with the gate insulator film having an excellent characteristic.

The protection film is made of a conductive material and serves as a gate electrode together with the conductive film in the gate region of the MIS transistor.

Since the gate insulator film of the MIS transistor is composed of only the dielectric film, the gate insulator film can be further reduced in thickness. Therefore, an operation performance of the MIS transistor is enhanced with the clean, thin gate insulator film.

When the protection film is a polysilicon film, the polysilicon film of the protection film has so high density that contamination matters are barred from passing therethrough. In addition, the polysilicon is usually used as a material of the electrode, thus the polysilicon film matches the electrode.

The protection film is of two-layer film made of a conductive film and an insulator film thereon, and the conductive film serves as a floating gate electrode.

Accordingly, the MIS transistor with the floating gate electrode, i.e., a FAMOS transistor can be obtained without increase in the numbers of masks and steps required for manufacturing the bipolar transistor. Thus, obtained is a low cost semiconductor device with the bipolar transistor and the FAMOS transistor.

When a side wall made of an insulating material is provided aside the contact hole of the bipolar transistor, a contact width of the electrode to the active region is narrow due to the side wall formed aside the contact hole of the bipolar transistor, so that dimension of the active region such as the emitter obtained by diffusion of impurity from the electrode is more micro than dimension determined by photolithography and a parasitic amount between the emitter and the base is reduced. Thus, the semiconductor with excellent, high-speed, low dissipation bipolar transistor and MIS transistor is obtained.

In the method, the step of forming a source and a drain by ion-implant to a region where the MIS transistor is to be formed, using the gate electrode of the MIS transistor as a mask are carried out after the step of forming each electrode.

Accordingly, since the source region and the drain region of the MIS transistor is self-aligned, a further micro MIS transistor is manufactured, with a result of excellent, high-speed, high-density semiconductor device.

PREFERRED EMBODIMENTS OF THE INVENTION

Description is made below about preferred embodiments of the invention, with reference to accompanying drawings.

First Embodiment

FIGS. 1-7 show a manufacturing process of a semiconductor device according to the first embodiment.

Figure 1:
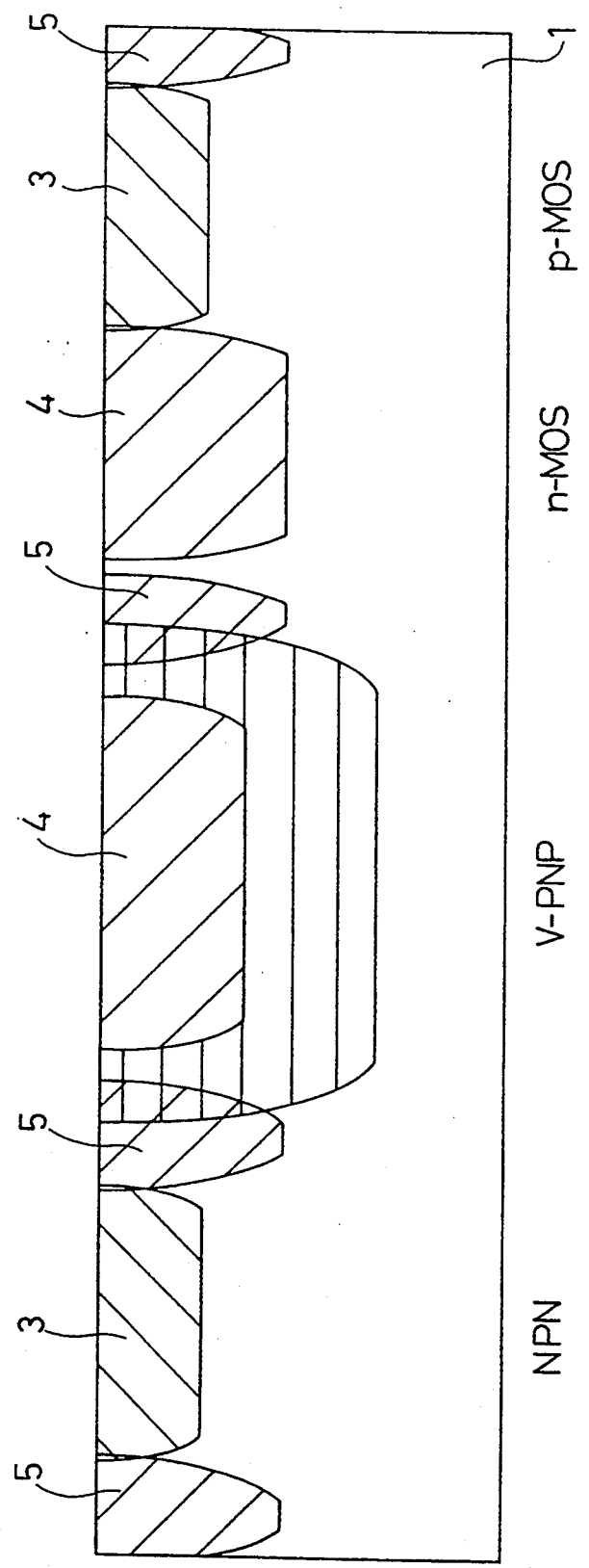
FIG. 1 is a section of a silicon substrate to which a lower buried region, a lower isolation region and the like are formed in a manufacturing process according to a first embodiment.

First, as shown in FIG. 1, after phosphorus ions are implanted to a P-type (111) silicon substrate 1 of 10-20 $\Omega$.cm resistivity under conditions of 40 keV and $1 \times 10^{13}$ cm$^{-2}$, heat treatment at 1200° C. is conducted for 120 minutes to form an N$^-$ type buried layer 2 for isolating a collector region of a vertical PNP transistor from the P-type silicon substrate 1. After arsenic ions are implanted using a resist as a mask under conditions of 60 keV and $2 \times 10^{15}$ cm$^{-2}$, the heat treatment at 900° C. is conducted for 30 minutes to form collector buried layers 3a of the vertical NPN transistor and an N+ type buried layer 3b to be a substrate buried layer of a P-channel type MOS transistor. Then, after boron ions are implanted using the resist as a mask under conditions of 40 keV and $1 \times 10^{14}$ cm$^{-2}$, the heat treatment at 1100° C. is conducted for 180 minutes to form a P+ type buried layer 4a to be a collector buried layer of a vertical PNP transistor, a P+ type buried layer 4b to be a substrate buried layer of an N-channel type MOS transistor and a P+ type spare isolation region 5 to be a lower part isolation region at a part of an element isolation region. In this case, since the impurity diffusion coefficients of the arsenic, the boron and the phosphorus increase in this order, the N+ type buried layers 3a, 3b, the P+ type buried layers 4a, 4b, the spare isolation region 5 and the N− type buried layer 2 become deeper in this order.

Figure 2:
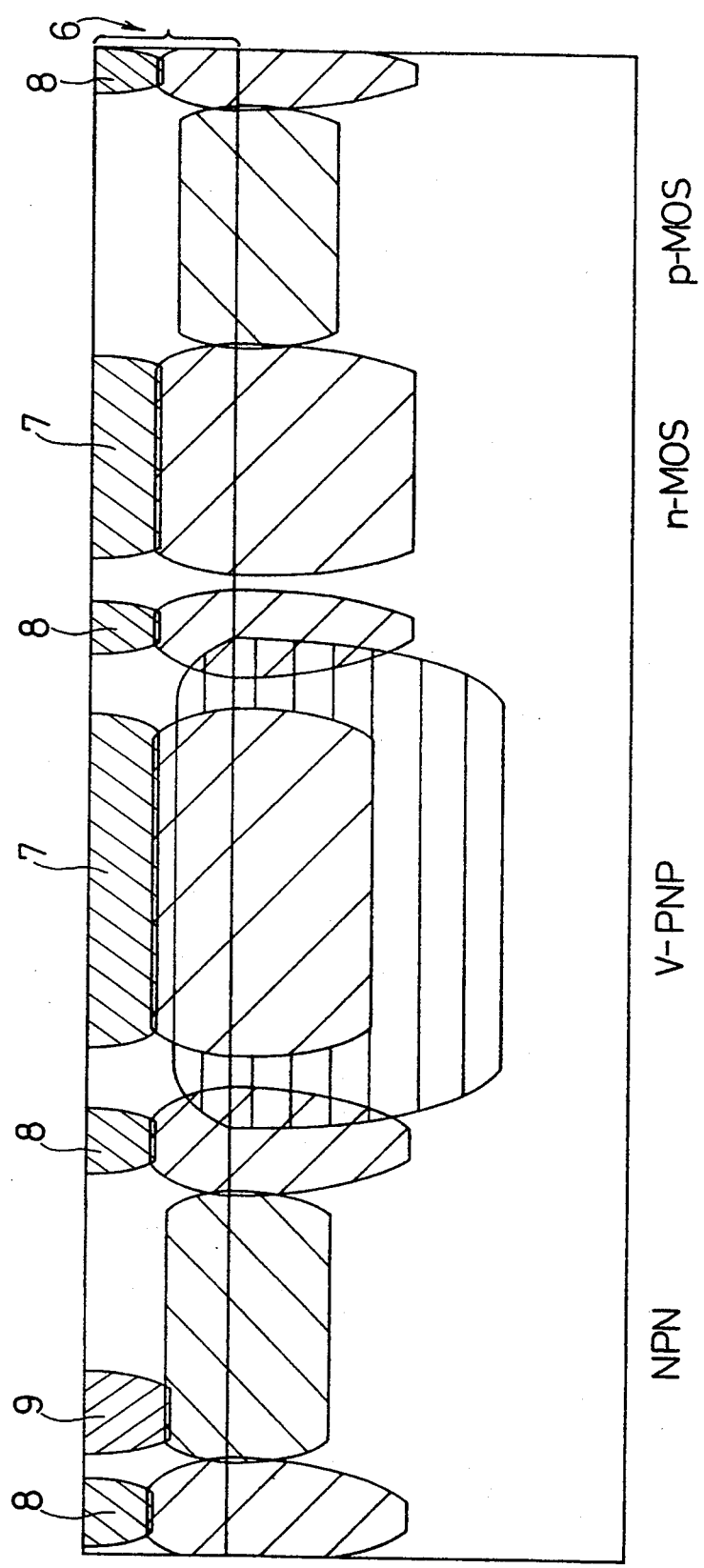
FIG. 2 is a section of the substrate to which an epitaxial layer is formed in the manufacturing process according to the first embodiment.

Next, as shown in FIG. 2, an N− type epitaxial layer 6 of 1 $\Omega$.cm resistivity and 2.5 $\mu$m thickness is formed on the P-type silicon substrate 1. After the boron ions are implanted using the resist as a mask under conditions of 80 keV and $2 \times 10^{12}$ cm$^{-2}$, the heat treatment at 1100° C. is conducted for 100 minutes to form a P−type diffusion layer 7a to be a part of a collector region of the vertical PNP transistor, P− type diffusion layer 7b to be a channel region of the N-channel type MOS transistor and a PN isolation region 8 to be an upper isolation region in a part of the element isolation region. In this case, since the impurity diffusion coefficients of the arsenic, the boron and the phosphorus increase in this order, the upward expansion amounts of the N+ type buried layers 3a, 3b, the P+ type buried layers 4a, 4b, the spare isolation region 5 and the N− type buried layer 2 increase in this order. After the phosphorus ions are implanted using the resist as a mask under conditions of 80 keV and $3 \times 10^{15}$ cm$^{-2}$, the heat treatment at 950° C. is conducted for 30 minutes, then the heat treatment at 1000° C. is conducted for 145 minutes to form an N+ type diffusion layer 9 to be a collector wall region of the vertical NPN transistor.

Figure 3:
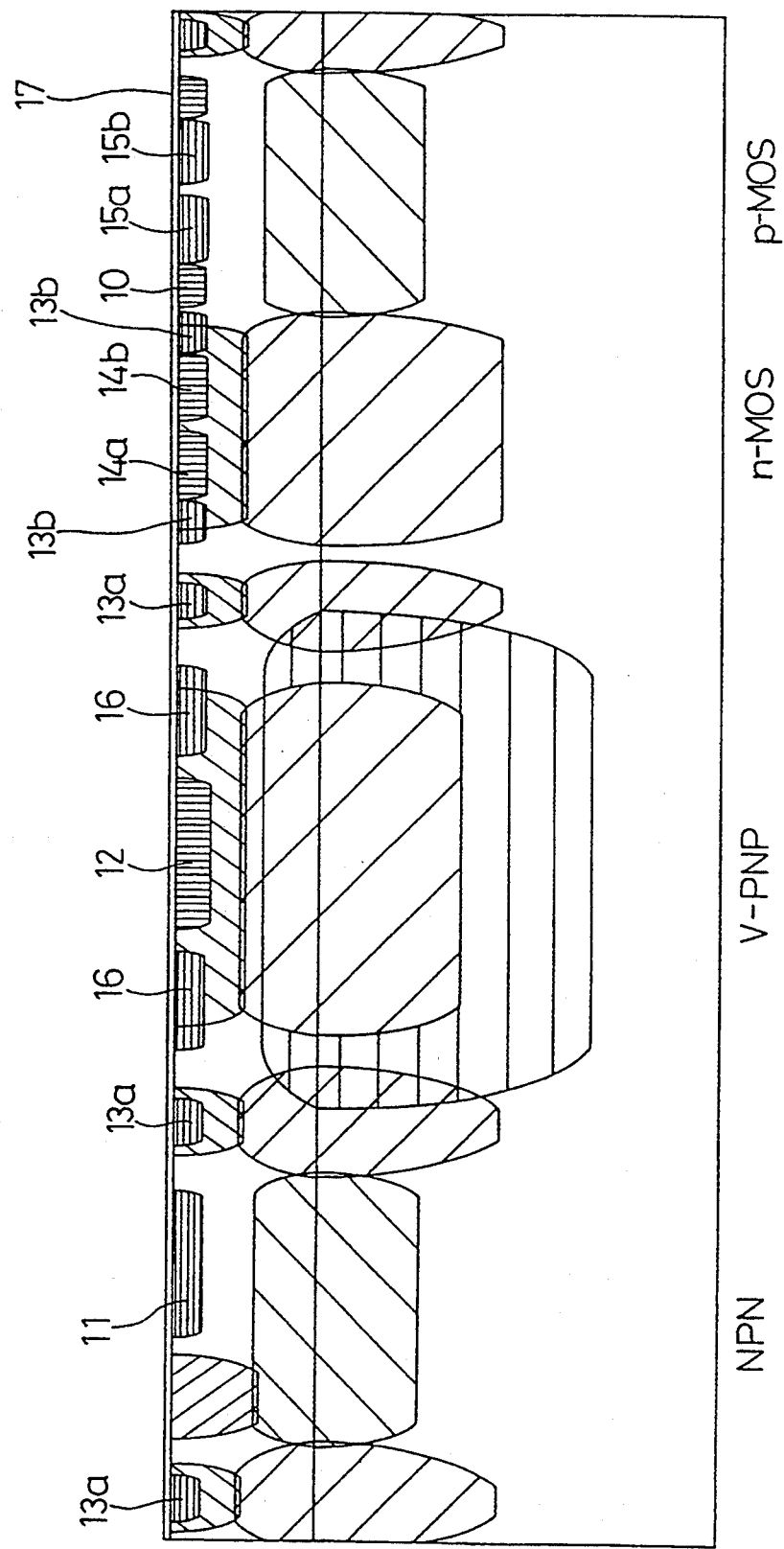
FIG. 3 is a section of the substrate to which ion-implant to an active region is conducted and a silicon oxide film is formed in the manufacturing process according to the first embodiment.

Next, as shown in FIG. 3, after the boron ions are implanted using the resist as a mask under conditions of 30 keV and $2 \times 10^{13}$ cm$^{-2}$, the heat treatment at 900° C. is conducted for 30 minutes to form a P− type active base layer 11 to be a base region of the vertical NPN transistor, a P− type diffusion layer 16 to be a collector wall region of the vertical PNP transistor, a P− type channel stopper 13a to be a channel stopper of the N-channel type MOS transistor, P− type diffusion layers 15a, 15b to be respectively a source and a drain of the P-channel type MOS transistor and a P− type isolating diffusion layer 13b to be a part of the element isolation region. The phosphorus ions are implanted using the resist as a mask under conditions of 80 keV and $4 \times 10^{13}$ cm$^{-2}$, then formed are an N− type active base layer 12 to be a base region of the vertical PNP transistor, an N− type channel stopper 10 to be a channel stopper of the P-channel type MOS transistor, N− type diffusion layers 14a, 14b to be respectively a source and a drain of the N-channel type MOS transistor. Next, dry-oxidization at 900° C. is conducted for 30 minutes to form a silicone oxide film 17 of 18 nm thickness which is a dielectric film.

Figure 4:
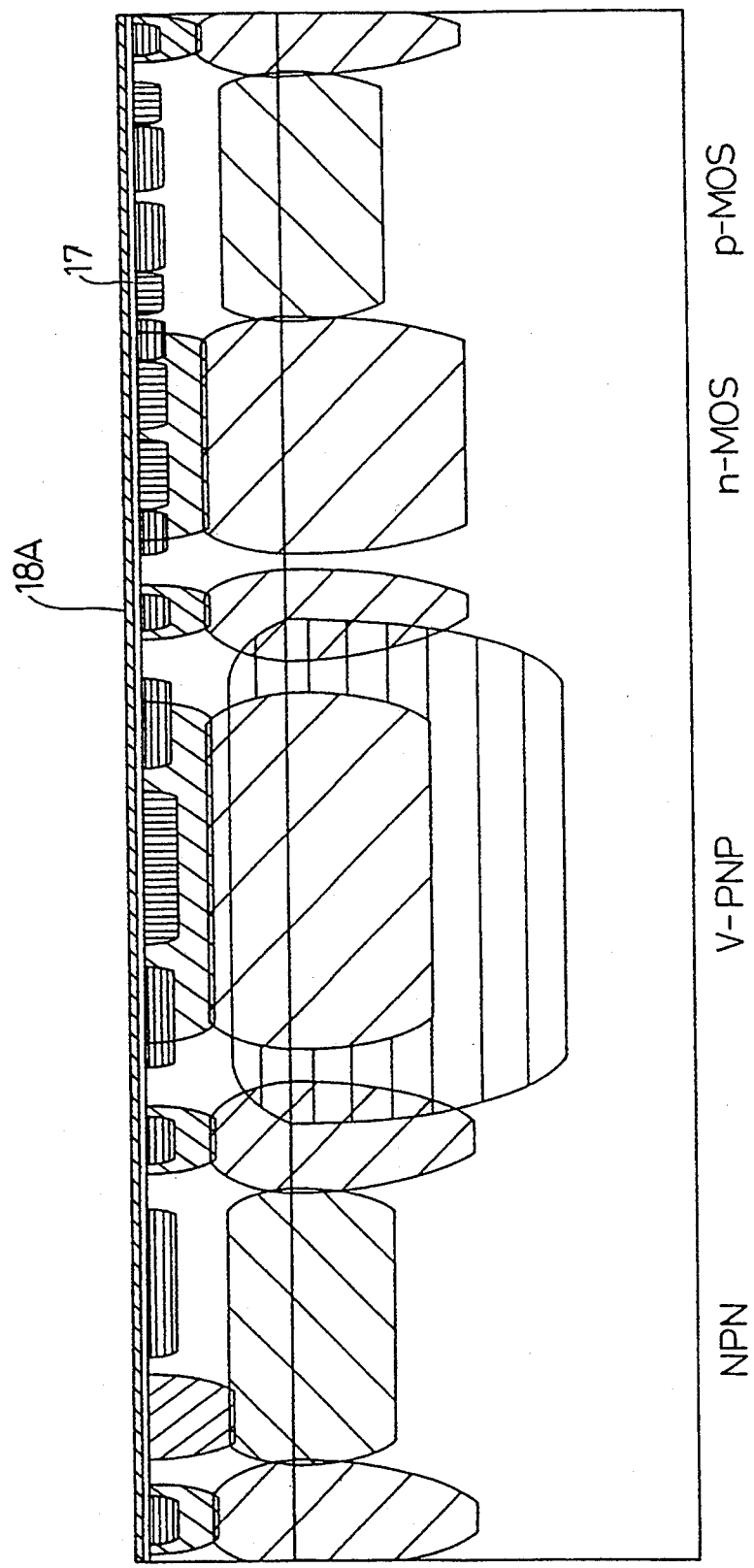
FIG. 4 is a section of the substrate to which a silicon nitride film is formed in the manufacturing process according to the first embodiment.

Then, as shown in FIG. 4, after the silicone oxide film 17 is formed, a silicon nitride film 18A of 50 nm thickness is formed thereon as a protection film. The silicon nitride film 18A is an insulator film for isolating the polysilicon emitter electrode from the active base diffusion layer of the vertical NPN transistor and the vertical PNP transistor. The silicon oxide layer 17 is for the N-channel type MOS transistor and the P-channel type MOS transistor.

Figure 5:
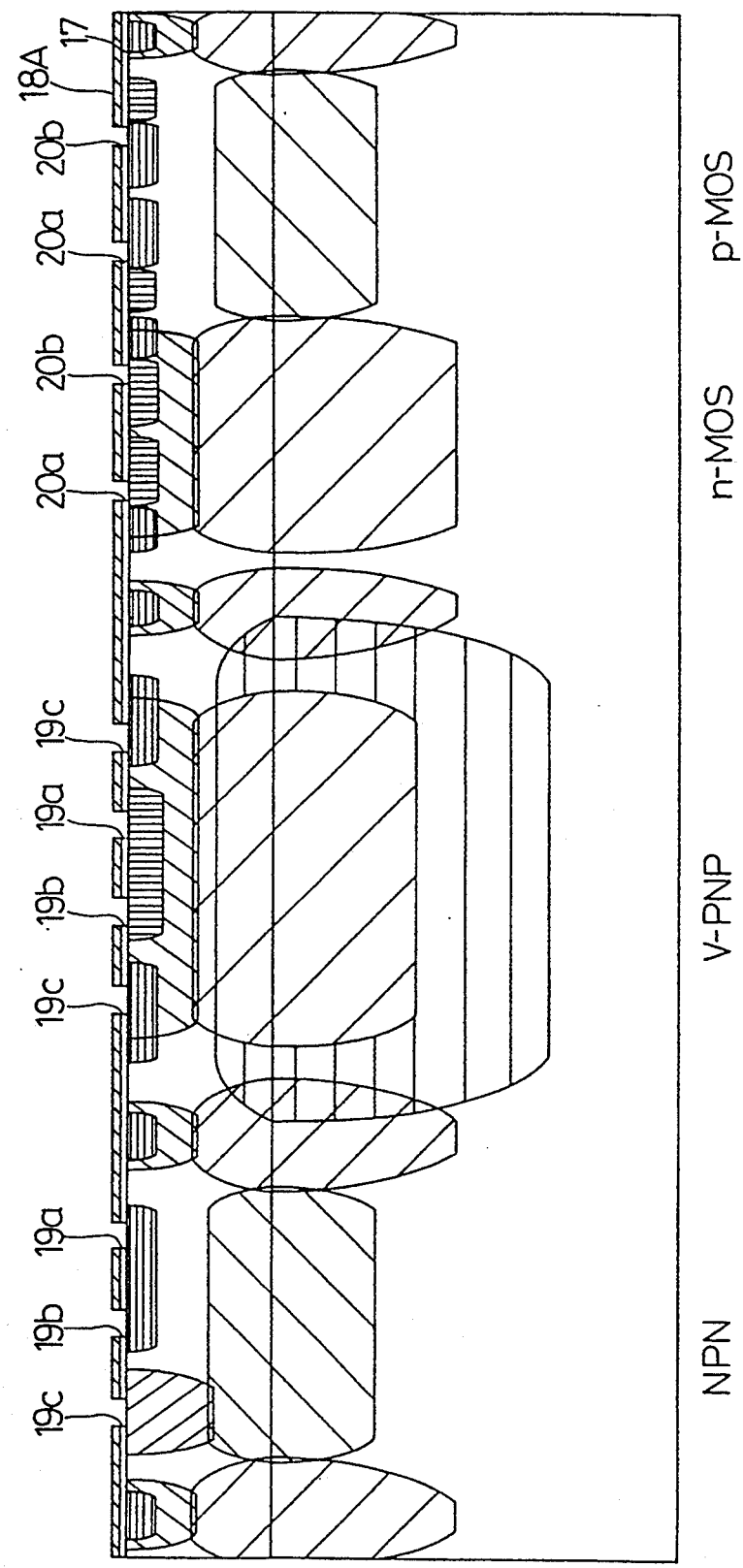
FIG. 5 is a section of the substrate to which a contact hole of a bipolar transistor is formed in the manufacturing process according to the first embodiment.

Next, as shown in FIG. 5, the silicon nitride film 18A and the silicon oxide film 17 are dry-etched using the resist as a mask to form collector contact holes 19c, base contact holes 19b, emitter contact holes 19a (for diffusion) of the vertical NPN transistor and the vertical PNP transistor, and source contact holes 20a and drain contact holes 20b of the N-channel type MOS transistor and the P-channel type MOS transistor.

Figure 6:
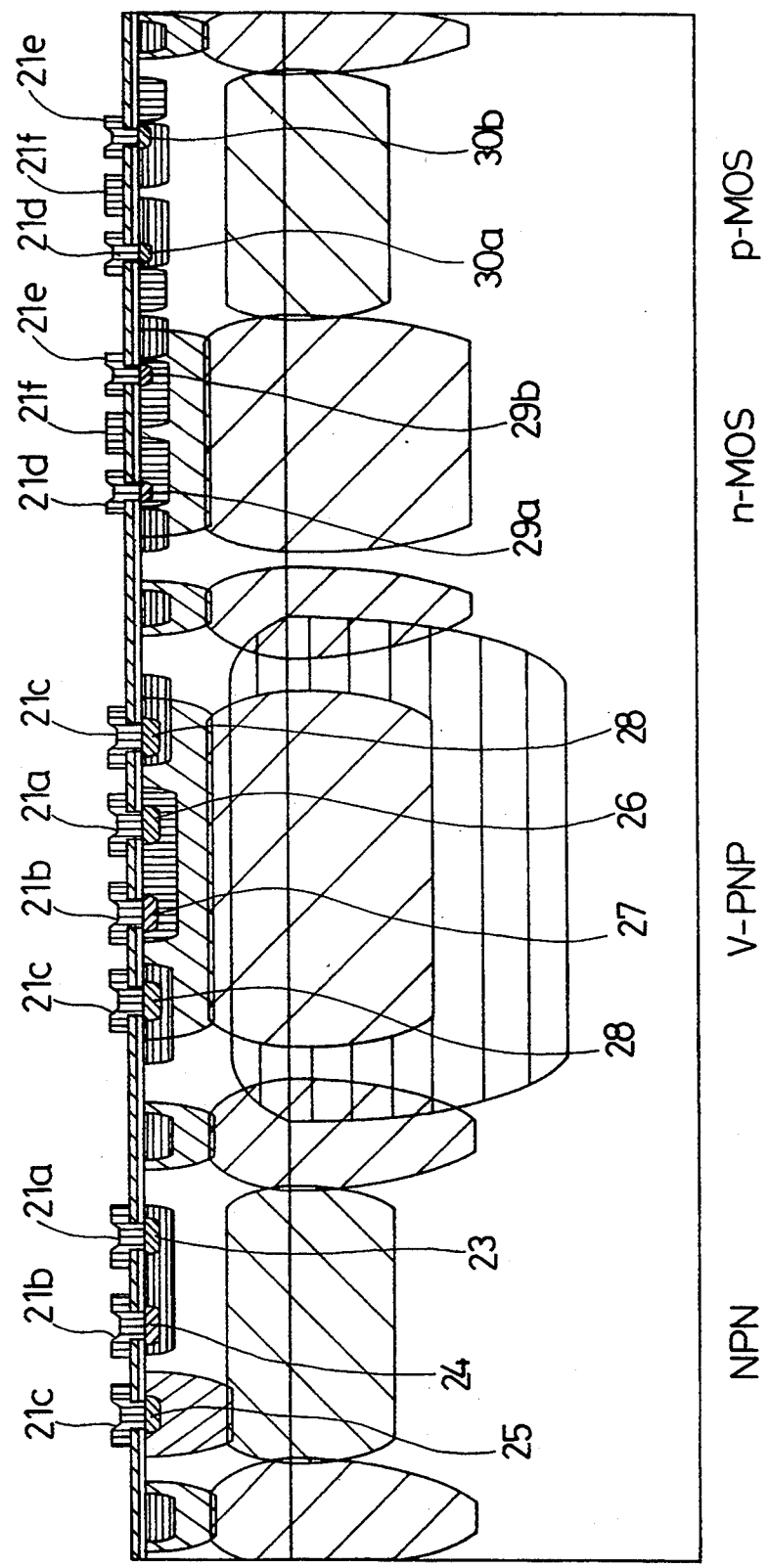
FIG. 6 is a section of the substrate to which a polysilicon electrode is formed in the manufacturing process according to the first embodiment.

Next, as shown in FIG. 6, after a polysilicon film 21 of 300 nm thickness is formed according to a low pressure CVD method, the polysilicon film 21 is dry-etched to form emitter electrodes 21a, base electrodes 21b and collector electrodes 21c of the vertical NPN transistor and the vertical PNP transistor and source electrodes 21d, drain electrodes 21e and gate electrodes 21f of the N-channel type MOS transistor and the P-channel type MOS transistor. The arsenic ions are implanted into the polysilicon film 21, using the resist as a mask, under conditions of 60 keV and $1 \times 10^{16}$ cm$^{-2}$, then the heat treatment at 950° C. is conducted for 60 minutes, so that the arsenic ions are diffused from the polysilicon film 21 to form an N+ base contact 27 of the vertical PNP transistor, an N+ collector contact 25 and an N+ emitter layer 23 of the vertical NPN transistor, and an N+ source contact 29a and an N+ drain contact 29b of the N-channel type MOS transistor. Further, the boron ions are implanted into the polysilicon film 21, using the resist as a mask, under conditions of 30 keV and $2 \times 10^{16}$ cm$^{-2}$, and the heat treatment at 900° C. is conducted for 60 minutes so that the boron ions are diffused from the polysilicon film 21 to form a P+ base contact 24 of the vertical NPN transistor, a P+ collector contact 28 and a P+ emitter layer 26 of the vertical PNP transistor, and a P+ source contact 30a and P+ drain contact 30b of the P-channel type MOS transistor.

Figure 7:
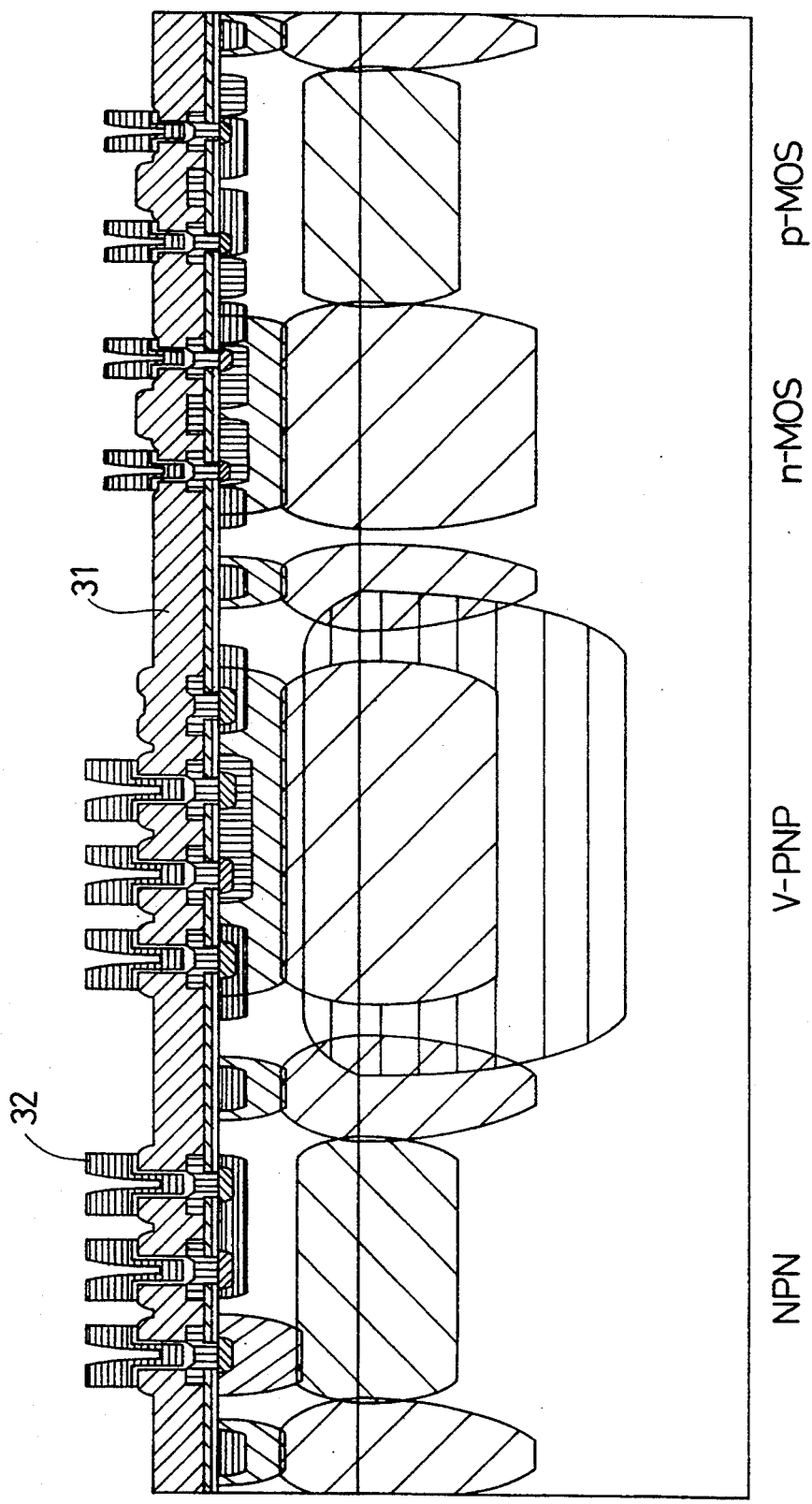
FIG. 7 is a section of the substrate to which an Al wiring is formed in the manufacturing process according to the first embodiment.

As shown in FIG. 7, an NSG film 31 of 800 nm thickness is formed as an insulator layer between respective electrodes according to the low pressure CVD method, and the NSG film 31 on each electrode are dry-etched using the resist as a mask. Finally, an Al is formed as a metallic electrode, using a sputter, and an Al wiring 32 to be an Al electrode wiring is formed using the resist as a mask.

As described above, according to the first embodiment, since the silicon nitride film 18A as the protection film is formed on the silicon oxide film 17 to be the gate insulator film of the MOS transistor, the silicon oxide film 17 is protected by the high-density silicon nitride film 18A so that contamination accompanied by resist coating and etching is prevented at the formation of the contact holes such as the emitter contact holes 19a, the source contact holes 20a by dry-etching using the resist as a mask. In detail, until the formation of the polysilicon film 21 to be the gate electrode 21f from the formation of the silicon nitride film 18A, the silicon nitride film 18A to be a part of the gate insulator film of the MOS transistor is exposed to various kinds of contamination sources because of the formation of the emitter contact holes 19a and the like, using the resist as a mask. However, since the composition of the silicon nitride film 18A is too dense to permeate contamination matters into the silicon nitride film 18A and to have the silicon oxide film 17 contaminated through the silicon nitride film 18A. Further, when a surface of the silicon nitride film 18A contaminated is well cleaned before the formation of the polysilicon film 21, a clean surface is obtained. Thus, an excellent MOS transistor and a bipolar transistor are formed at the same time because of the clean gate electrodes 21f with clean gate insulator film.

Further, the silicon oxide film 17 and the silicon nitride film 18A serve as the gate insulator film of the MOS transistor and as the isolation insulator film between the emitter electrode 21a and the subsurface silicon substrate of the bipolar transistor, with a result that a step for removing the silicon nitride film 18A is unnecessary.

Particularly, when the protection film is the silicon nitride film 18A, the silicon oxide film 17 is covered with the silicon nitride film 18A so that the silicon oxide film 17 and the silicon nitride film 18A are not etched even though a dip-etching with hydrogen fluoric acid required for removing a natural oxide film is conducted immediately before the polysilicon film 21 is formed after the formation of contact holes such as the emitter contact holes 19a.

Therefore, degradation and deficiency of characteristic of the MOS transistor whose gate insulator film is the silicon oxide film 17 and the silicon nitride film 18A are prevented without thickness dispersion of the silicon oxide film 17 and the silicon nitride film 18A and pin holes. Also, as to the bipolar transistor, as well as the MOS transistor, the thickness dispersion of the silicon oxide film 17 and the silicon nitride film 18A and the pin holes are not caused by using the silicon oxide film 17 and the silicon nitride film 18A as the insulator film between the emitter electrode 21a and the silicon surface, thus preventing deficiency in durability to high voltage between the emitter and the base and characteristic degradation due to leakage current therebetween.

The components of the MOS transistor are formed concurrently with the steps of forming the bipolar transistor: for example, the source, the drain diffusion layer and the channel stopper of the MOS transistor are formed concurrently with the formation of the active base layer of the bipolar transistor, the gate electrode of the MOS transistor and the emitter electrode of the bipolar transistor are formed at the same time, and the like. Thus, there is no increase in the numbers of masks and the manufacturing steps, compared with the manufacturing process of the bipolar transistor, with a result of a low cost semiconductor device with Bi-MOS structure.

Second Embodiment

Figure 8:
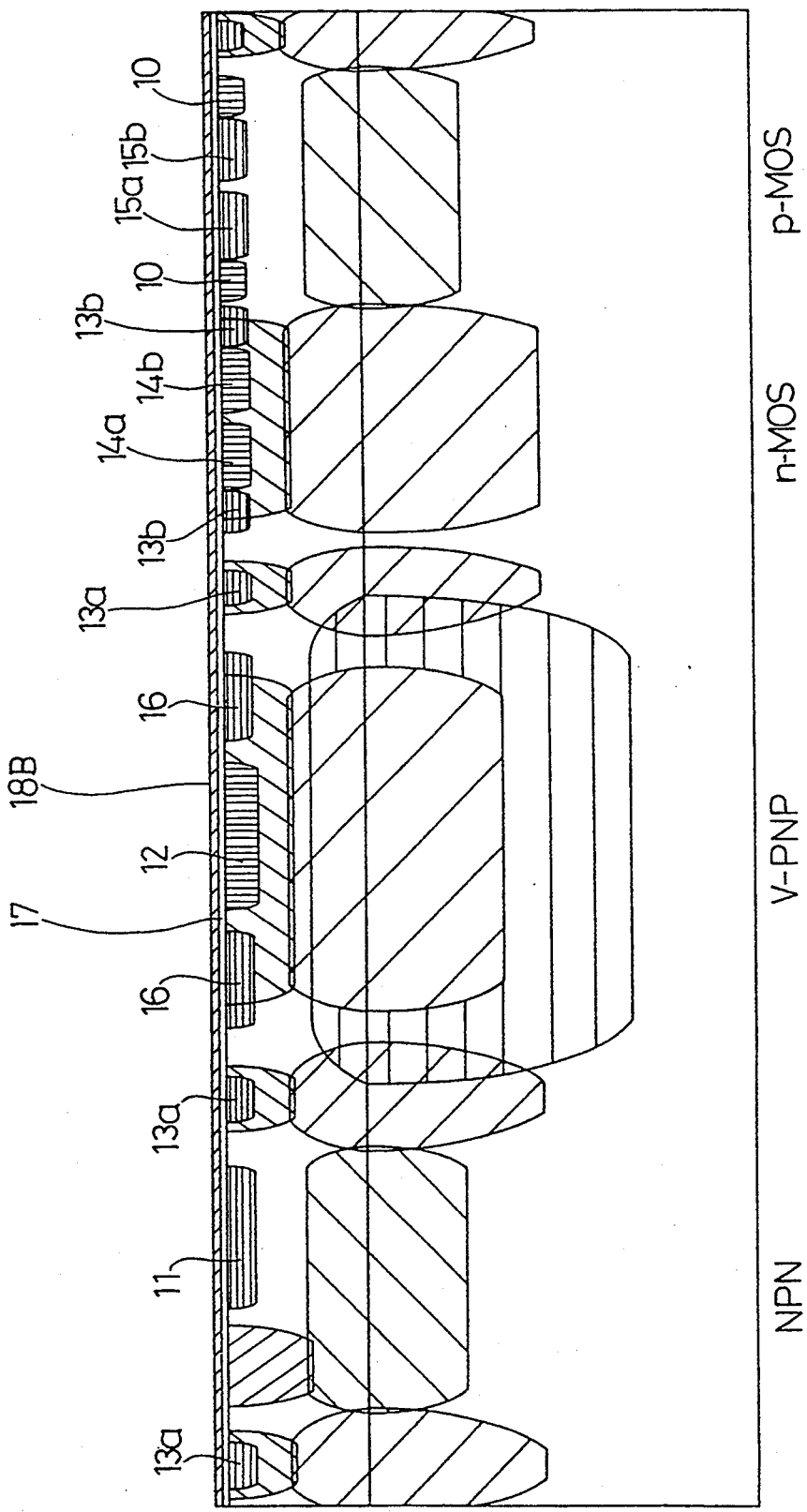
FIG. 8 is a section of the substrate to which a polysilicon film is formed in a manufacturing process according to a second embodiment.
Figure 9:
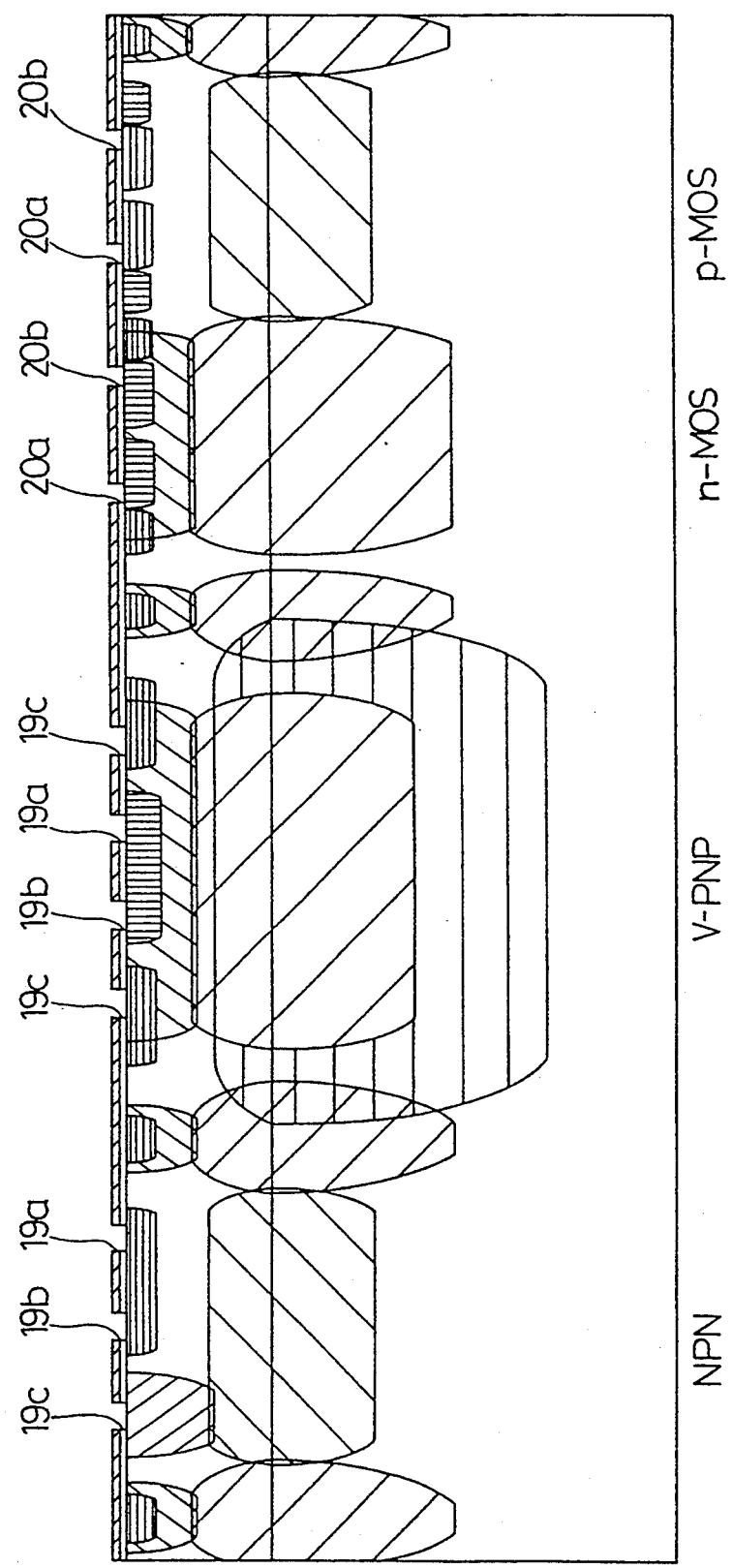
FIG. 9 is a section of the substrate to which the contact hole of the bipolar transistor is formed in the manufacturing process according to the second embodiment.
Figure 10:
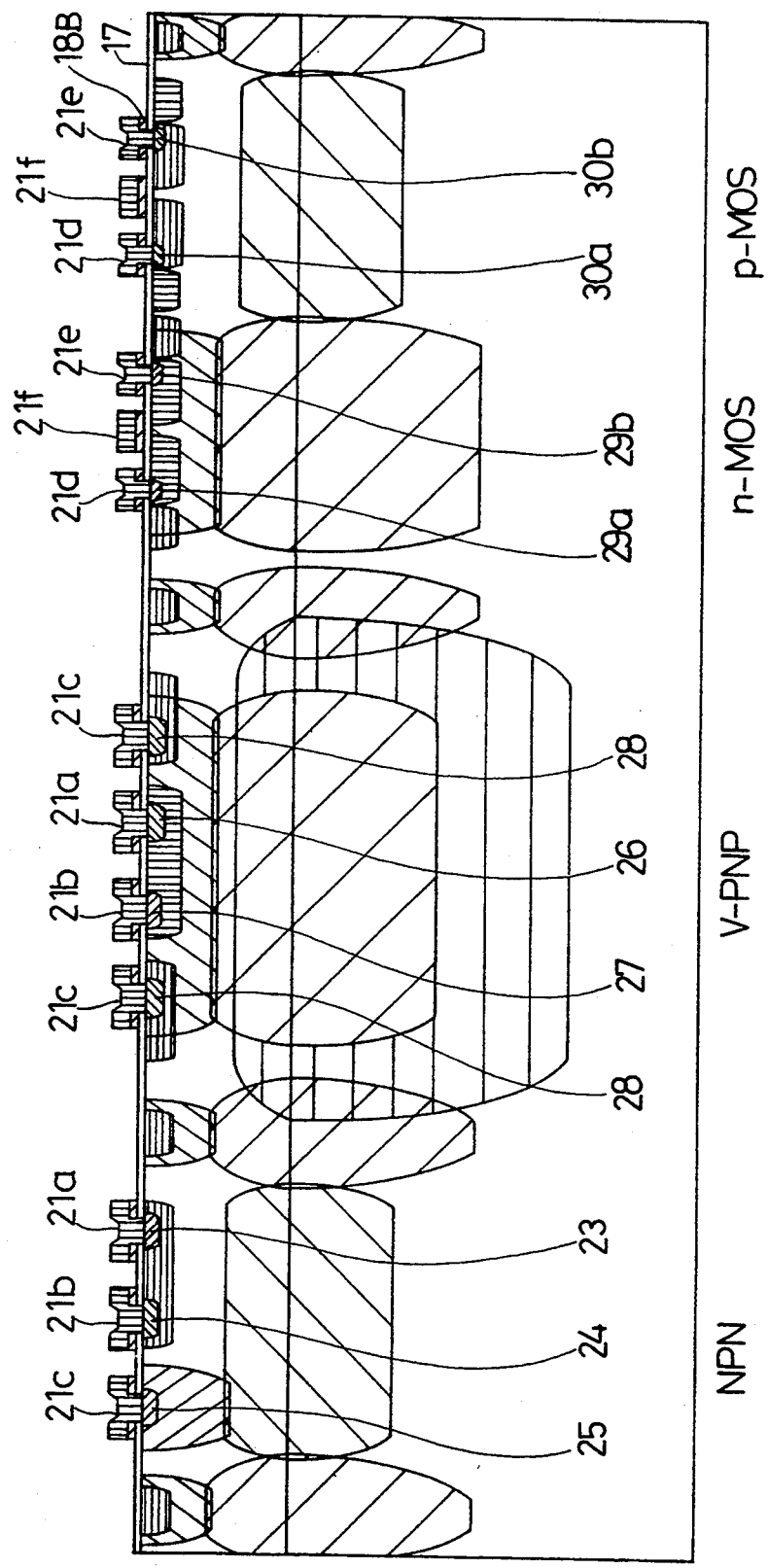
FIG. 10 is a section of the substrate to which the polysilicon electrode is formed in the manufacturing process according to the second embodiment.

FIGS. 8–10 show manufacturing steps of a semiconductor device according to the second embodiment. The step shown in FIG. 8 is conducted after the steps shown in FIGS. 1–3 in the first embodiment.

Immediately after the step of forming the silicon oxide film 17 shown in FIG. 3, a polysilicon film 18B of 50 nm thickness as the protection film is formed according to the low pressure CVD method as shown in FIG. 8, instead of the silicon nitride film 18A in FIG. 4.

As shown in FIG. 9, the polysilicon film 18B and the silicon oxide film 17 are dry-etched using the resist as a mask to form each contact hole 19a–20b as well as in FIG. 4.

Then, a polysilicon film 21 of 30 nm thickness is formed on the substrate according to the low pressure CVD method and selectively dry-etched to form each electrode 21a–21f as shown in FIG. 10 and as well as in FIG. 6. The arsenic ions are implanted and diffused into the polysilicon film 21 in the same manner as in FIG. 6 to form the N+ base contact 27, the N+ collector contact 25, the N+ emitter layer 23, the N+ source contact 29a and the N+ drain contact 29b. Further, the boron ions are implanted and diffused into the polysilicon film 21 in the same manner as in FIG. 6 to form the P+ base contact 24, the P+ collector contact 28, the P+ emitter layer 26, the P+ source contact 30a and the P+ drain contact 30b.

Finally, the NSG film 31 and the Al wiring 32 are formed as well as in FIG. 7.

As described above, since the manufacturing process as same as in the first embodiment is performed, the same effects in the first embodiment are displayed.

Moreover, since the gate insulator film is made of only the silicon oxide film 17, the gate insulator film is made thinner than that in the first embodiment. Consequently, a superior MOS transistor is formed without increase in the number of masks and manufacturing steps required for forming the bipolar transistor.

Third Embodiment

Figure 11:
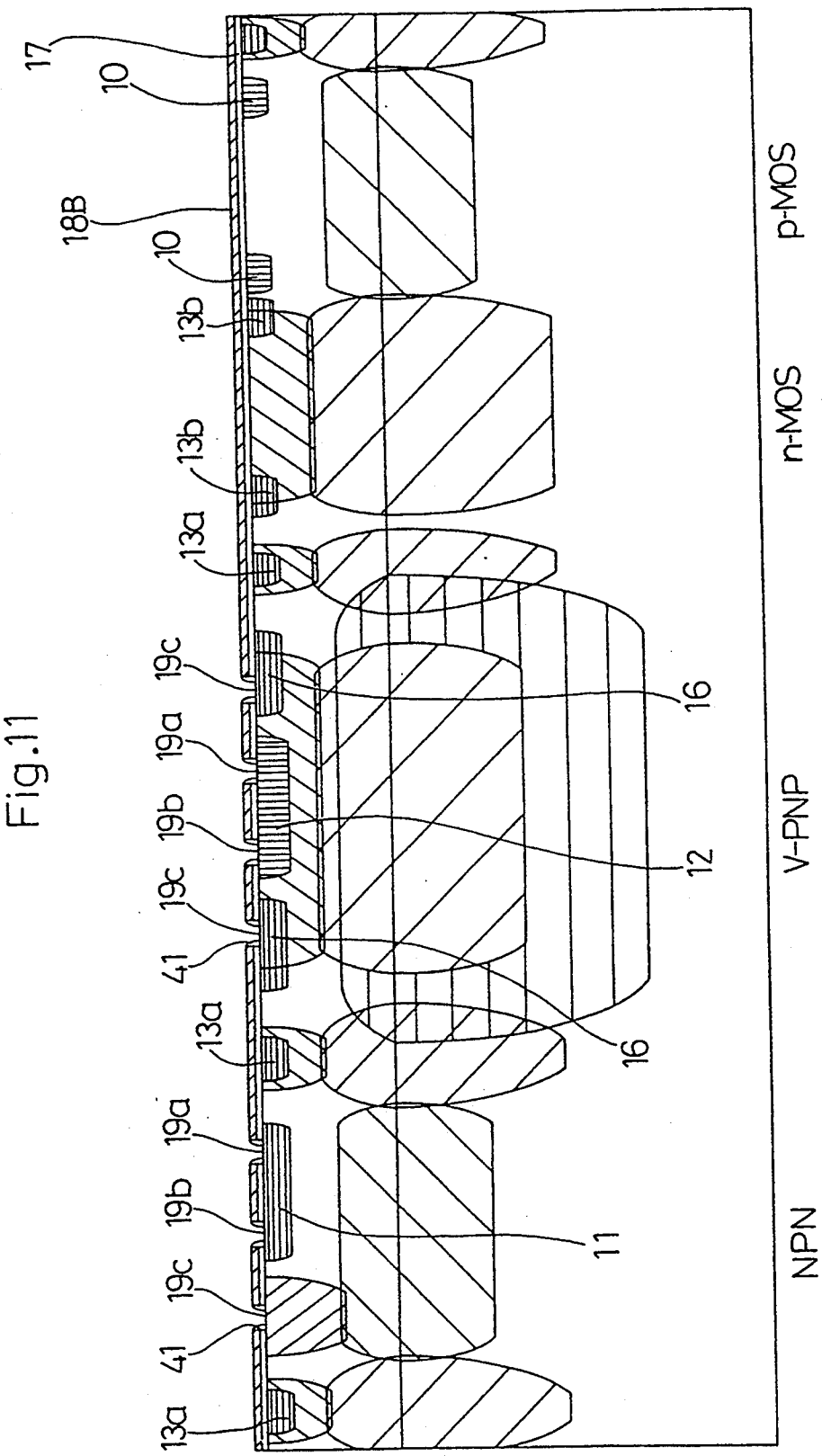
FIG. 11 is a section of the substrate to which the silicon oxide film and the polysilicon film are formed and the contact hole of the bipolar transistor is formed in a manufacturing process according to a third embodiment.
Figure 12:
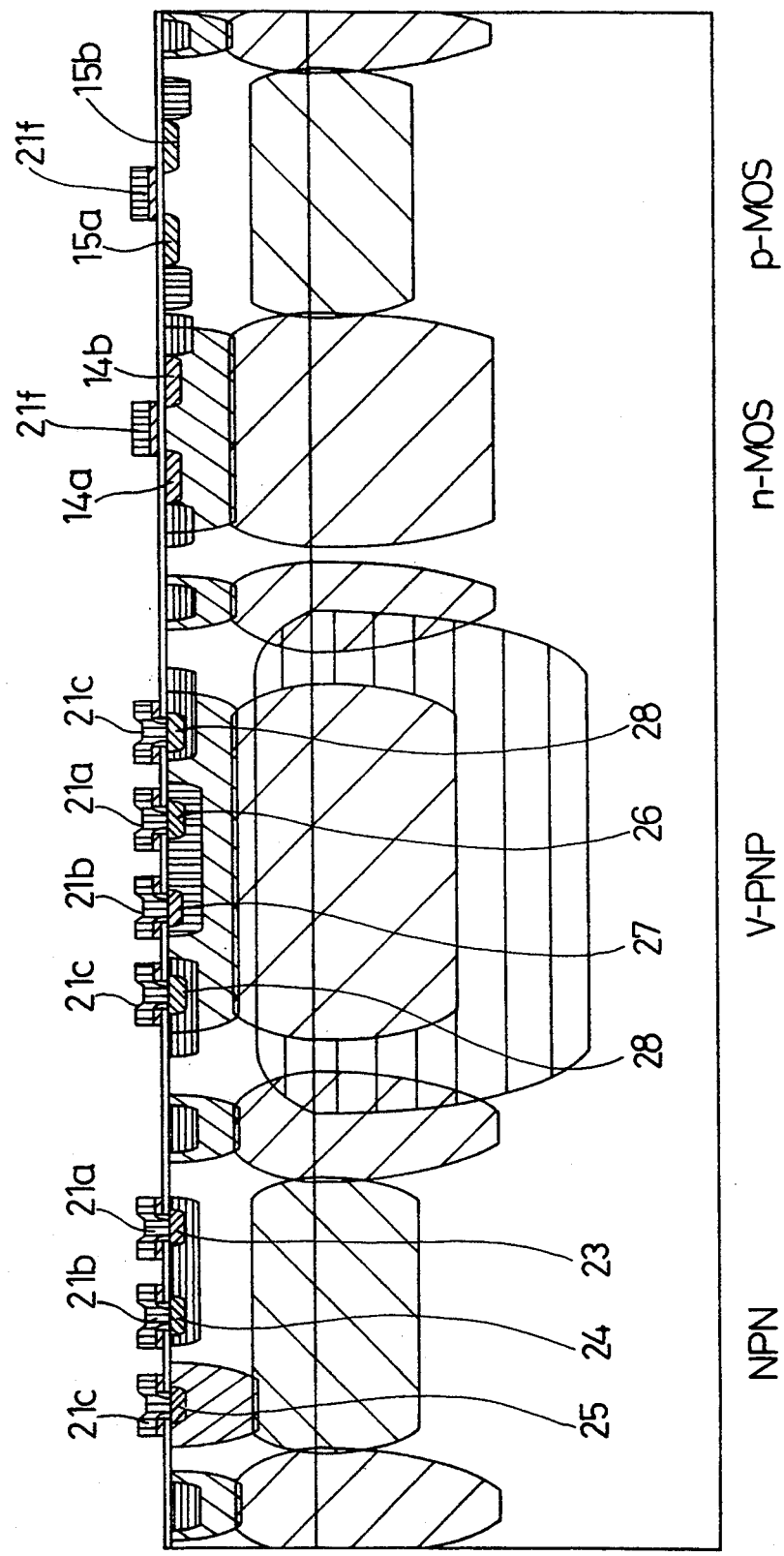
FIG. 12 is a section of the substrate to which the polysilicon electrode is formed and an active region of the transistor is formed in the manufacturing process according to the third embodiment.
Figure 13:
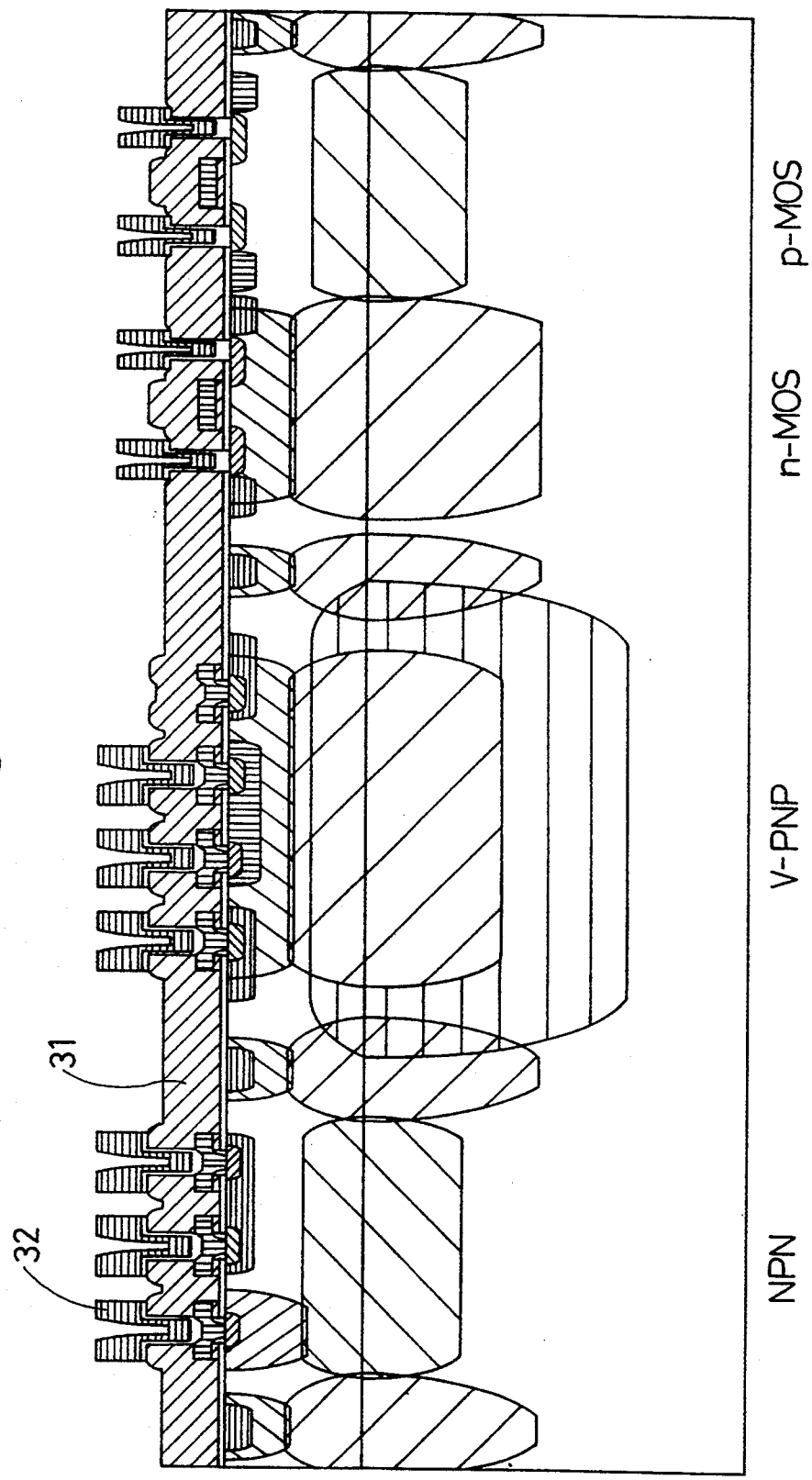
FIG. 13 is a section of the substrate to which the Al wiring is formed in the manufacturing process according to the third embodiment.

FIGS. 11–13 show manufacturing steps of a semiconductor device according to the third embodiment. The manufacturing step in FIG. 11 is carried out after the steps in FIGS. 1 and 2 in the first embodiment.

After the N+ type diffusion layer 9 to be a collector wall region of the vertical NPN transistor is formed as shown in FIG. 2, the implant of the boron ions and the heat treatment as in FIG. 3 are carried out to form the P− type active base layer 11, the P− type diffusion layer 16, the P− type channel stopper 13a and the P− type isolating diffusion layer 13b. Then, the phosphorus ions are implanted as in FIG. 2 to form the N− type active base layer 12 and the N− type channel stopper 10. Wherein, the N− type diffusion layers 14a, 14b are not formed.

The dry-oxidization as in FIG. 2 is conducted to form the silicon oxide film 17 of 18 nm thickness. Immediately after the formation of the silicon oxide film 17, as shown in FIG. 11, the polysilicon film 18B of 50 nm thickness which is the protection film is formed thereon. The polysilicon film 18B and the silicon oxide film 17 are dry-etched using the resist as a mask to form each contact hole 19a–19c of the vertical NPN transistor and the vertical PNP transistor. The HTO film other than each side of the contact holes 19a–19c is wholly removed by etching, and side walls 41 of the HTO film are formed aside each contact hole 19a–19c.

Then, the polysilicon film 21 of 300 nm thickness is formed according to the low pressure CVD method and dry-etched using the resist as a mask to form, as shown in FIG. 12, each electrode 21a–21c of the vertical NPN transistor and the vertical PNP transistor and the gate electrodes 21f of the N-channel type MOS transistor and the P-channel type MOS transistor. Using the gate electrodes 21f as a self alignment mask, the arsenic ions are implanted under the conditions as in FIG. 6 into the silicon subsurface substrate in the source region and the drain region of the N-channel type MOS transistor, and the arsenic is diffused from the polysilicon film 21 or in the silicon subsurface substrate to form the N+ base contact 27, the N+ collector contact 25, the N+ emitter layer 23 and the N+ source 14c and the N+ drain 14d of the N-channel type MOS transistor. Using the resist or the like as a mask on the bipolar transistor side and the gate electrode 21f as a self alignment mask on the P-channel type MOS transistor side, the boron ions are implanted and diffused under the same conditions as in the first embodiment to form the P+ base contact 24, the P+ collector contact 28, the P+ emitter layer 26 and the P+ source 15c and the P+ drain 15d of the P-channel type MOS transistor.

Next, as shown in FIG. 13, the NSG film 31 and the Al wiring 32 are formed as well as in the first embodiment (in FIG. 7).

In this embodiment, a different point from the second embodiment is only the formation of the source region and the drain region of the MOS transistor, thus displaying the same effects as in the second embodiment.

In addition, since the source region and the drain region of the MOS transistor are formed by the ion-implant into the subsurface silicon substrate, using the gate electrode as the self alignment mask, further microfabrication of the transistor is made possible than that in the second embodiment in which the source region and the drain region are formed using a mask. Consequently, an excellent, high-speed, high-density MOS transistor can be manufactured without increase in the numbers of the masks and the steps require for manufacturing a bipolar transistor.

Fourth Embodiment

Figure 14:
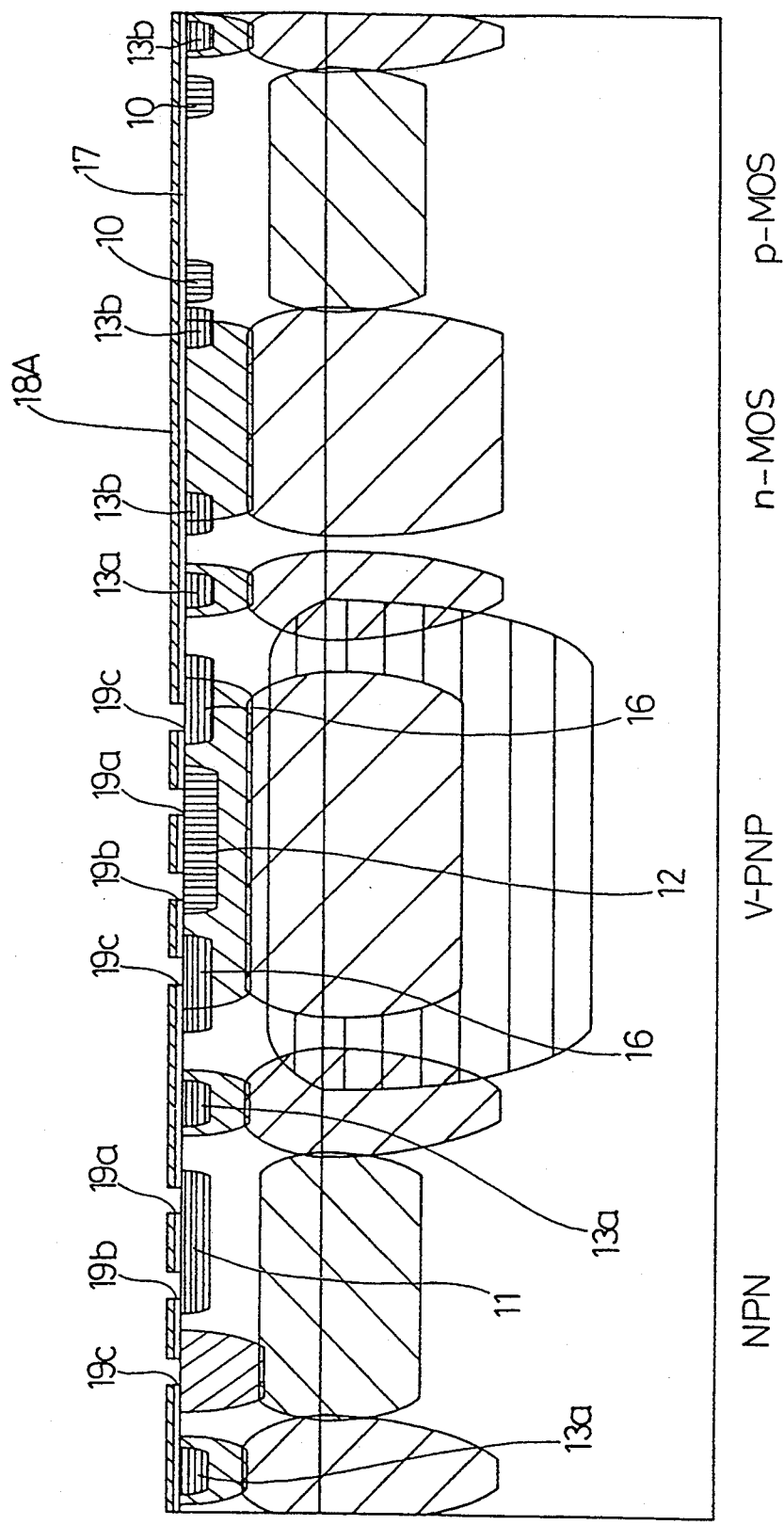
FIG. 14 is a section of the substrate to which the silicon oxide film and the silicon nitride film are formed and the contact hole is formed in a manufacturing process according to a fourth embodiment.
Figure 15:
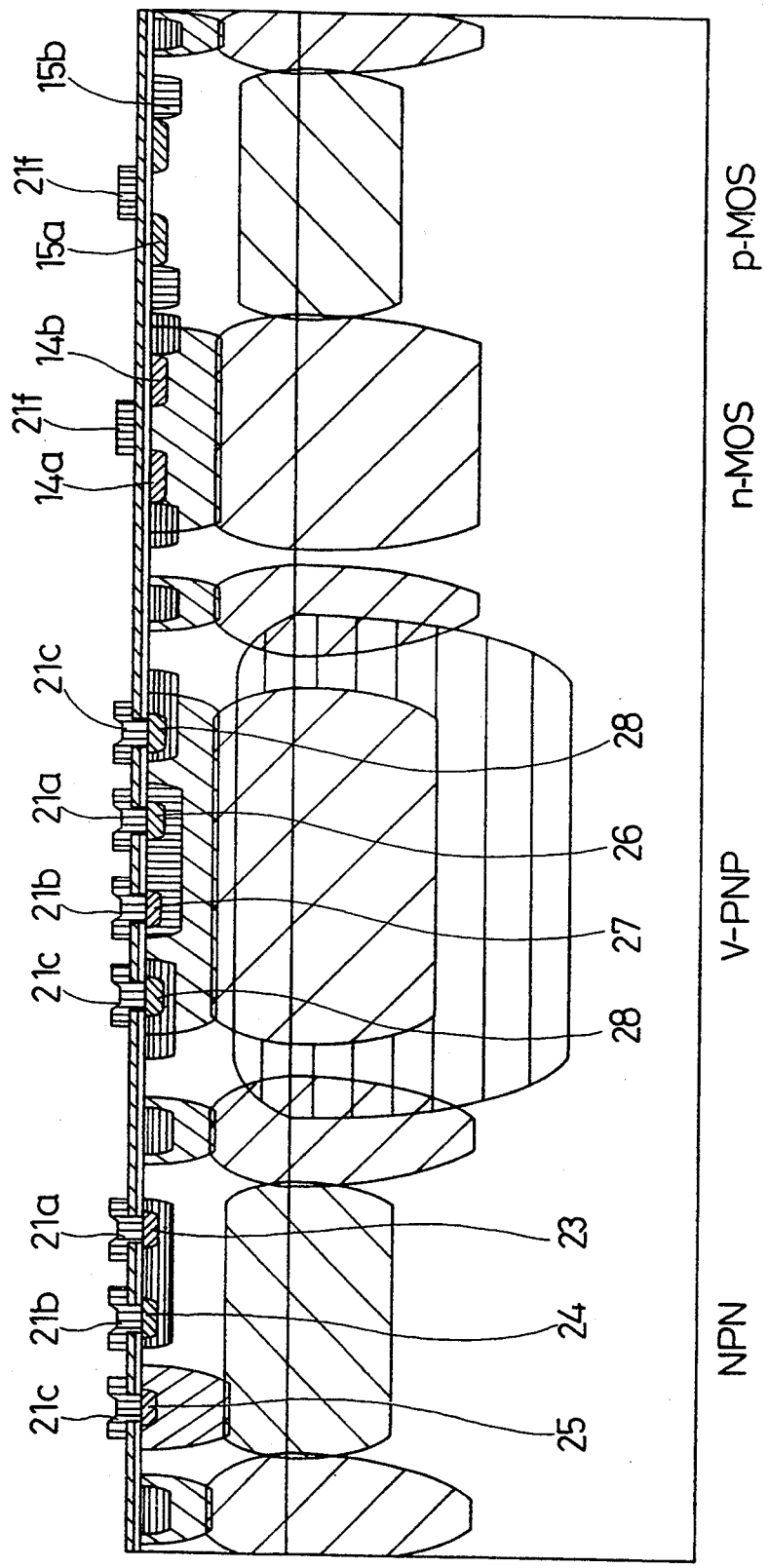
FIG. 15 is a section of the substrate to which the polysilicon electrode is formed and the active region is formed in the manufacturing process according to the fourth embodiment.
Figure 16:
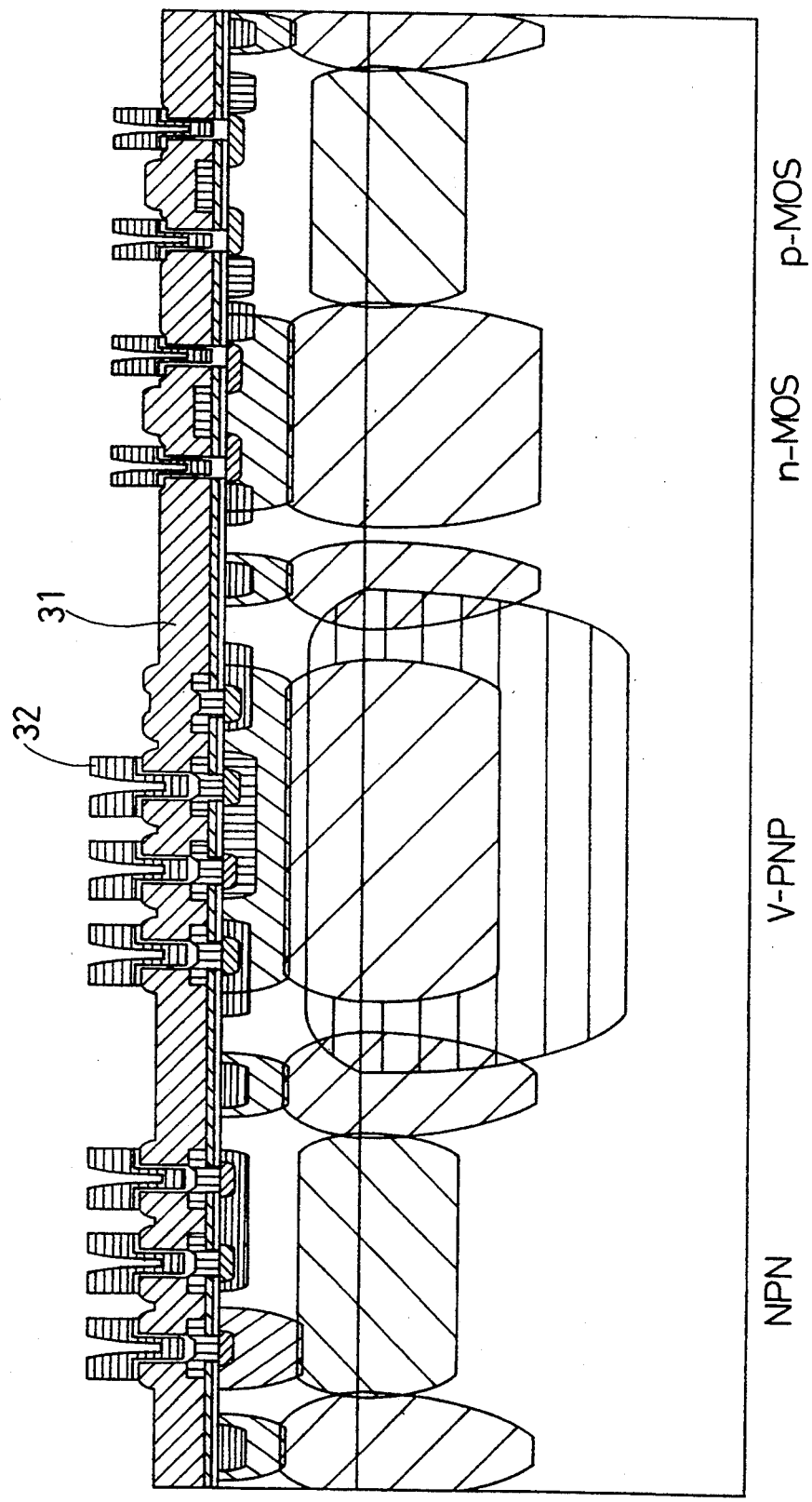
FIG. 16 is a section of the substrate to which the Al wiring is formed in the manufacturing process according to the fourth embodiment.

FIGS. 14–16 show manufacturing steps of a semiconductor device according to the fourth embodiment, wherein the manufacturing step in FIG. 14 is carried out after the steps in FIGS. 1 and 2 in the first embodiment.

After the N+ type diffusion layer 9 to be the collector wall region of the vertical NPN transistor is formed as shown in FIG. 2, the same implant of the boron ions and the same heat treatment as in FIG. 3 are carried out to from the P− type active base layer 11, the P− type diffusion layer 16, the P− type channel stopper 13a and the P− type isolating diffusion layer 13b. Then, the phosphorus ions are implanted under the same conditions as in FIG. 2 to form the N− type active base layer 12 and the N− type channel stopper 10.

The silicon oxide film 17 of 5 nm thickness is formed as shown in FIG. 14, and the silicon nitride film 18A of 20 nm thickness as the protection film is formed thereon.

Then, using the resist as a mask, the silicon nitride film 18A and the silicon oxide film 17 are dry-etched to form each contact hole 19a–19c of the vertical NPN transistor and the vertical PNP transistor.

Next, as shown in FIG. 15, the polysilicon film 21 of 300 nm thickness is formed on the substrate according to the low pressure CVD method and is dry-etched using the resist as a mask to form each electrode 21a–21c of the vertical NPN transistor and the vertical PNP transistor and the gate electrodes 21f of the N-channel type MOS transistor and the P-channel type MOS transistor. Then, the N+ base contact 27, the N+ collector contact 25, the N+ emitter layer 23, the N+ source 14c, the N+ drain 14d, the P+ base contact 24, the P+ collector contact 28, the P+ emitter layer 26, the P+ source 15c and the P+ drain 15d are formed in the same manner as in FIG. 12.

Then, as shown in FIG. 16, the NSG film 31 and the Al wiring 32 are formed as well as in the first embodiment (in FIG. 7).

In the fourth embodiment the manufacturing process of the bipolar transistor is the same as that in the first embodiment, and the formation of source and drain regions of the MOS transistors is different from that in the first embodiment but is the same as that in the third embodiment. Accordingly, the effects in the first and third embodiments are displayed.

In addition, the silicon oxide film 17 and the gate nitride film 18B of the MOS transistors are so thin (5 nm and 20 nm respectively) that the MOS transistors can be used as an MNOS type non volatile memory. In consequence, the MNOS type non volatile memory is manufactured at the same time without increase in the numbers of masks and manufacturing steps for the bipolar transistor.

Fifth Embodiment

Figure 17:
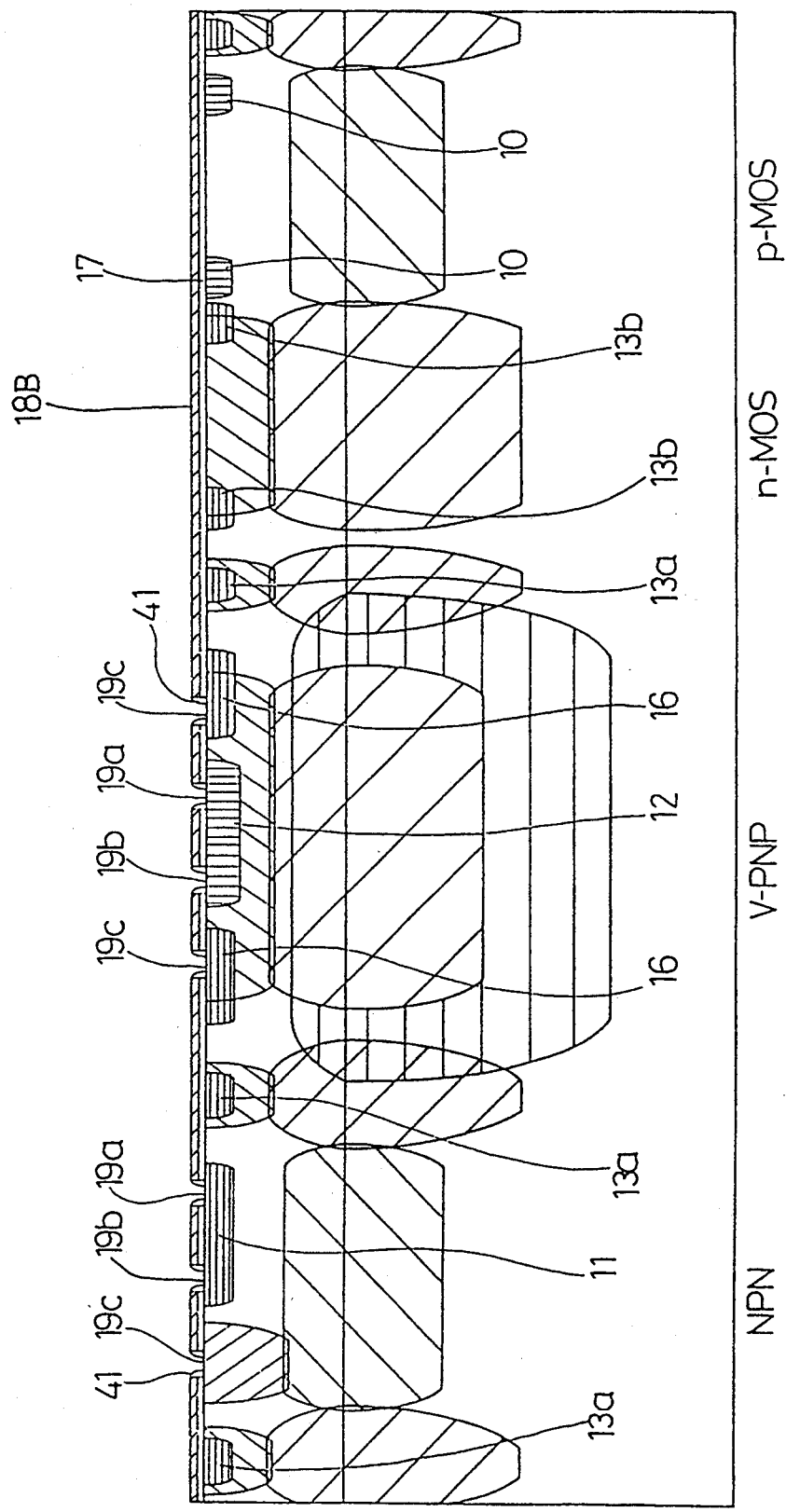
FIG. 17 is a section of the substrate to which the silicon oxide film and the polysilicon film are formed and the contact hole and a side wall of the bipolar transistor are formed in a manufacturing process according to a fifth embodiment.
Figure 18:
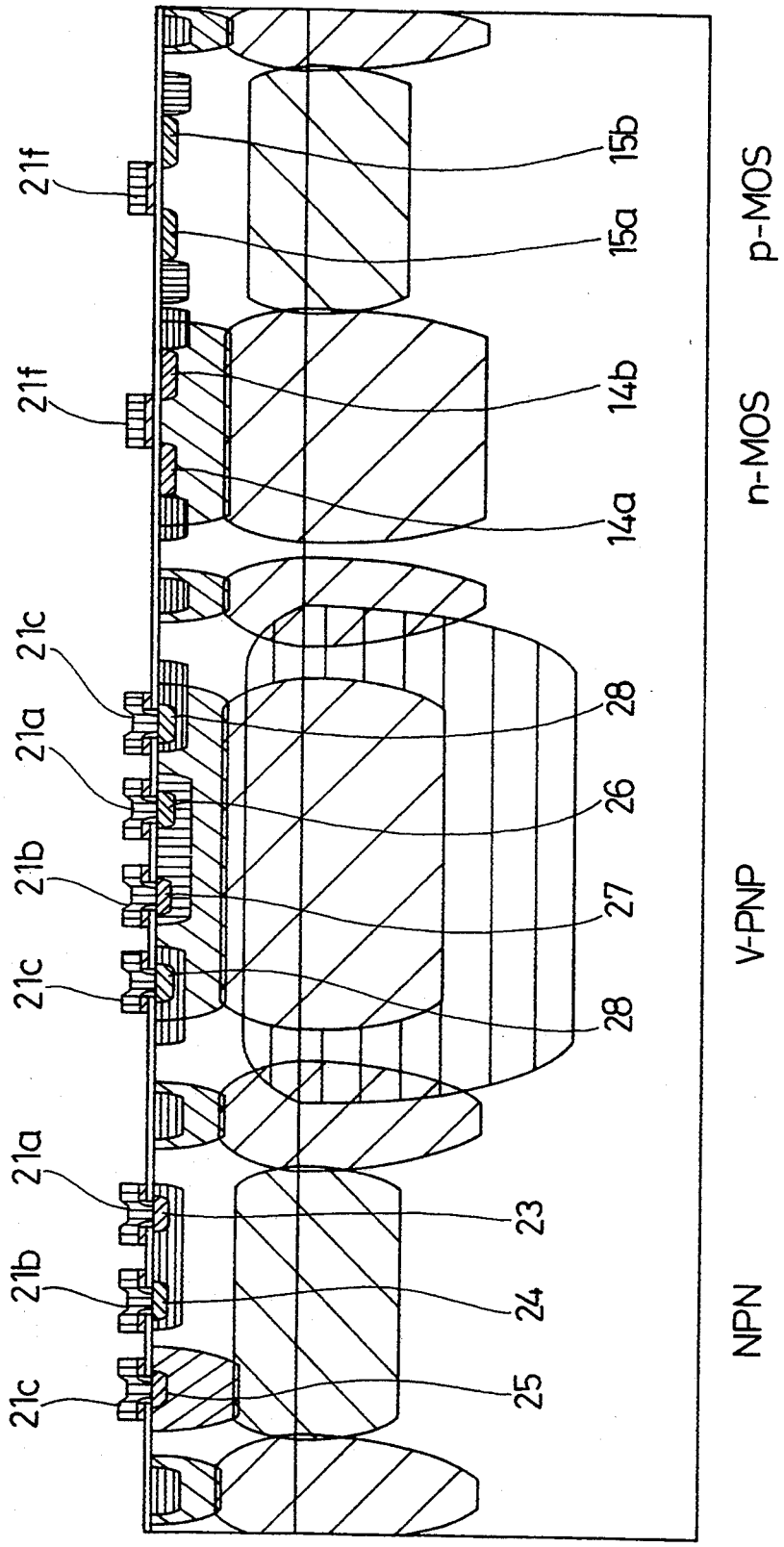
FIG. 18 is a section of the substrate to which the polysilicon electrode is formed and the active region of the transistor is formed in the manufacturing process according to the fifth embodiment.
Figure 19:
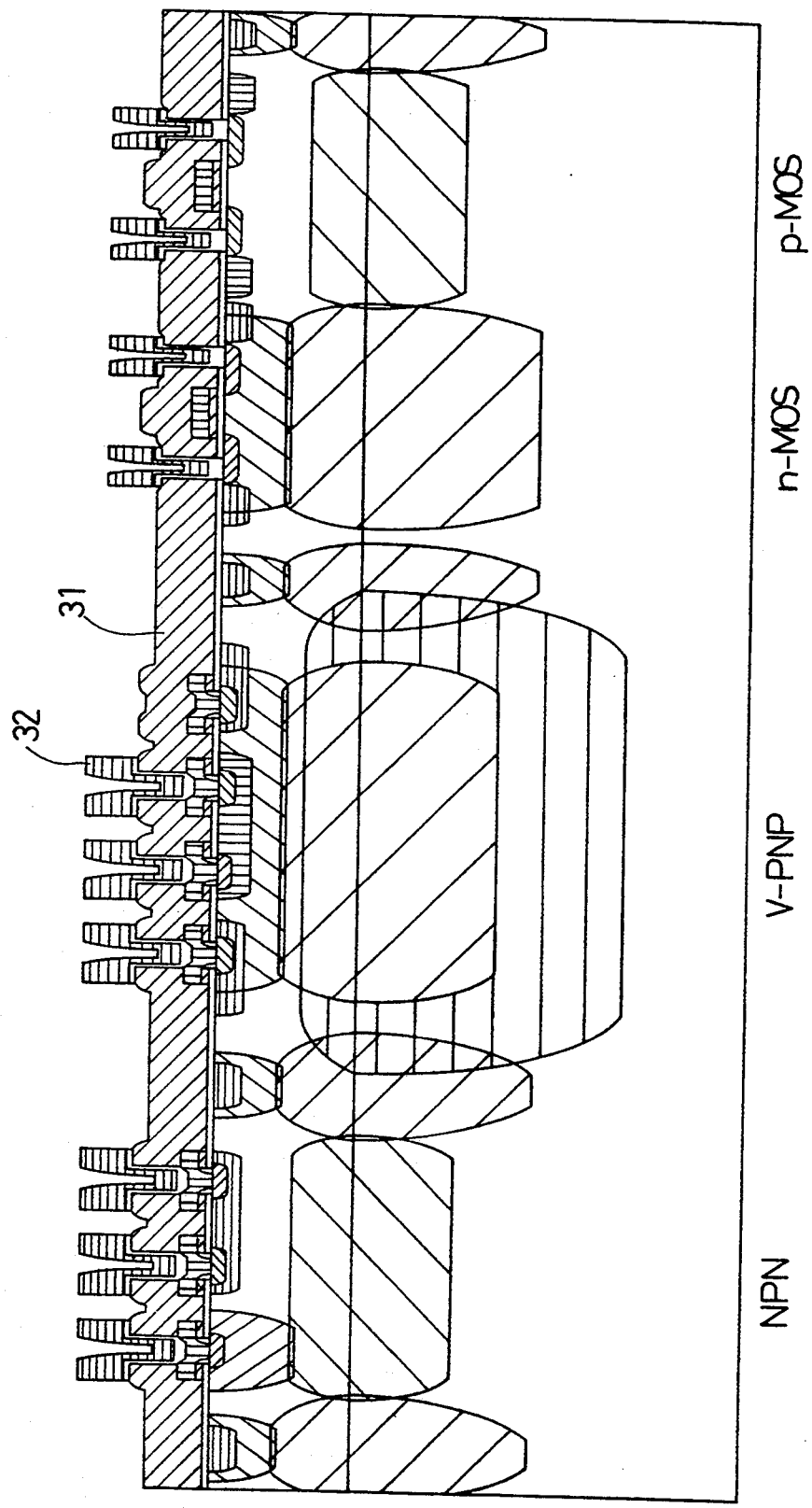
FIG. 19 is a section of the substrate to which the Al wiring is formed in the manufacturing process according to the fifth embodiment.

FIGS. 17–19 show manufacturing steps of a semiconductor device in the fifth embodiment, wherein the step in FIG. 17 is carried out after the steps in FIGS. 1 and 2 in the first embodiment.

As shown in FIG. 17, after the N+ type diffusion layer 9 to be the collector wall region of the vertical NPN transistor is formed, the implant of the boron ions and the heat treatment are conducted in the same way as in FIG. 3 to form the P− type active base layer 11, the P− type diffusion layer 16, the P− type channel stopper 13a and the P− type isolating diffusion layer 13b. The phosphorus ions are implanted as well as in FIG. 2 to form the N− type active base layer 12 and the N− type channel stopper 10. The same dry-oxidization as in FIG. 2 is conducted to form the silicon oxide film 17 of 18 nm thickness. Immediately thereafter, the polysilicon film 18B of 50 nm thickness as the protection film is formed thereon. Using the resist as a mask, the polysilicon film 18B and the silicon oxide film 17 are dry-etched to form each contact hole 19a–19c of the vertical NPN transistor and the vertical PNP transistor. After the resist is removed, an HTO film is entirely laid according to the low pressure CVD method, the HTO film other than each side of the contact holes 19a–19c is wholly removed by etching, and side walls 41 of the HTO film are formed aside each contact hole 19a–19c.

Then, as well as in FIG. 12, the polysilicon film 21 is formed and etched to form each electrode 21a–21c of the vertical NPN transistor and the vertical PNP transistor and the gate electrodes 21f of the N-channel type MOS transistor and the P-channel type MOS transistor. Further, the N+ base contact 27, the N+ collector contact 25, the N+ emitter layer 23, the N+ source 14c, the N+ drain 14d, the P+ base contact 24, the P+ collector contact 28, the P+ emitter layer 26, the P+ source 15c and the P+ drain 15d are formed.

Then, as shown in FIG. 19, the NSG film 31 and the Al wiring 32 are formed as well as in the first embodiment (in FIG. 7).

In the fifth embodiment, since a different point form the third embodiment is only the formation of the polysilicon contact holes of the bipolar transistor, the same effects as in the third embodiment can be displayed.

In addition, since the electrodes 21a–21c are formed after each side wall 41 is formed aside the respective contact holes of bipolar transistor, a narrower emitter width than that defined by photolithography is contemplated at the formation of the emitter, different from that in the third embodiment. Accordingly, a parasitic amount between the emitter and the base is reduced, and an excellent, high-speed, less dissipation bipolar transistor and the MOS transistor are manufactured concurrently without increase in the number of masks in the manufacturing process of the bipolar transistor.

Sixth Embodiment

Figure 20:
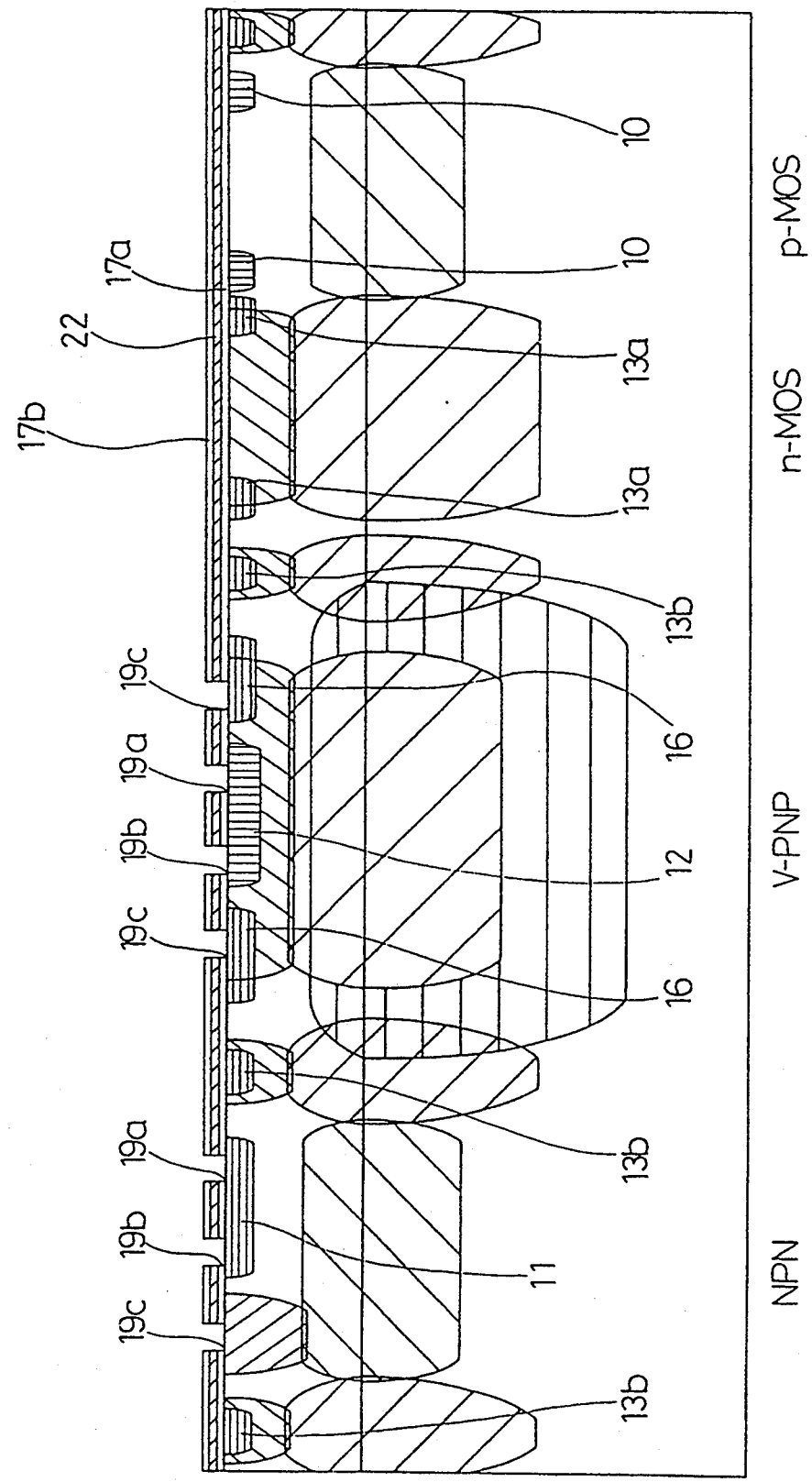
FIG. 20 is a section of the substrate to which two silicon oxide films and the polysilicon film therebetween are formed and the contact hole is formed in a manufacturing process according to a sixth embodiment.
Figure 21:
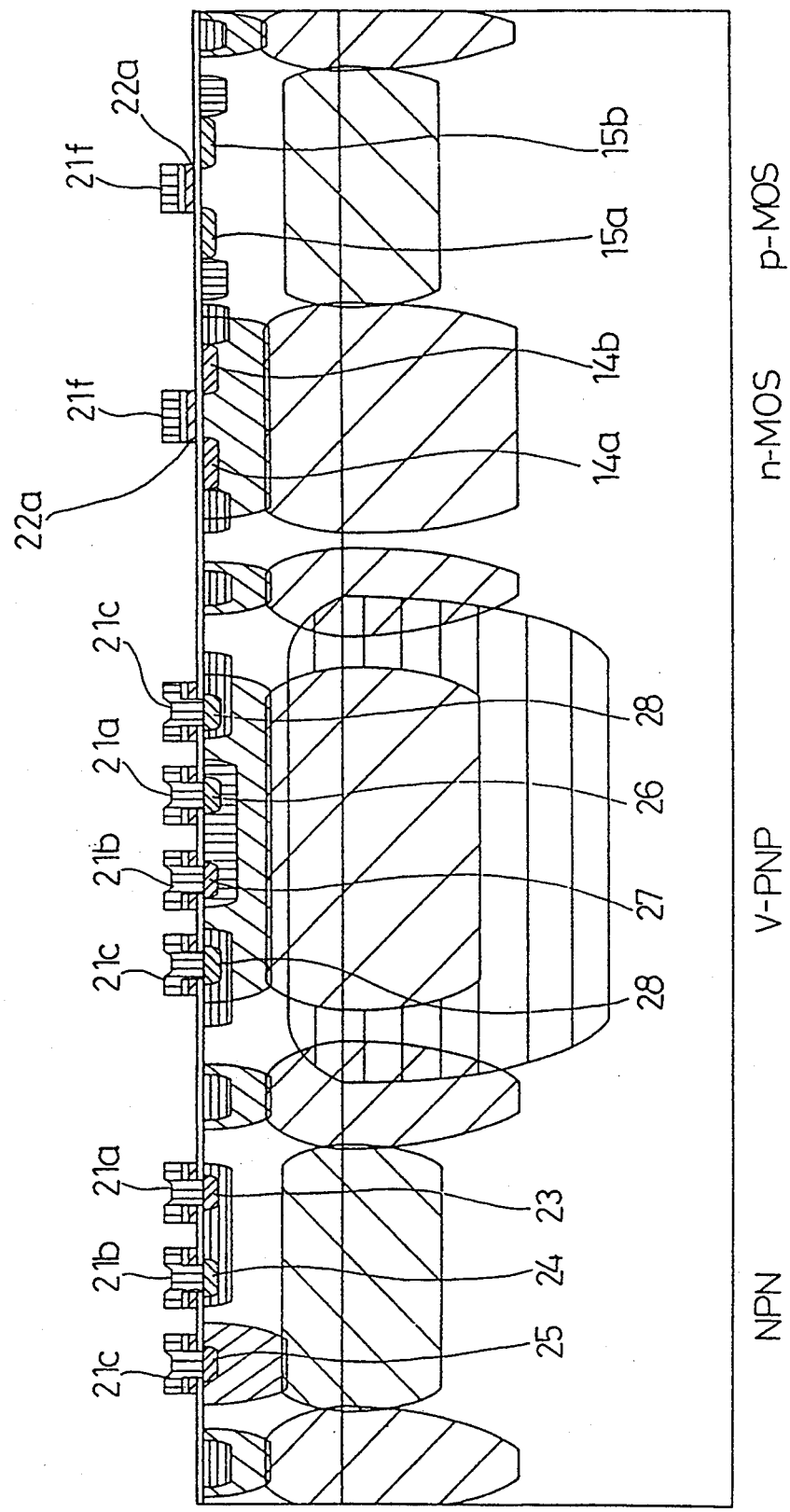
FIG. 21 is a section of the substrate to which the polysilicon electrode and a floating gate electrode are formed in the manufacturing process according to the sixth embodiment.
Figure 22:
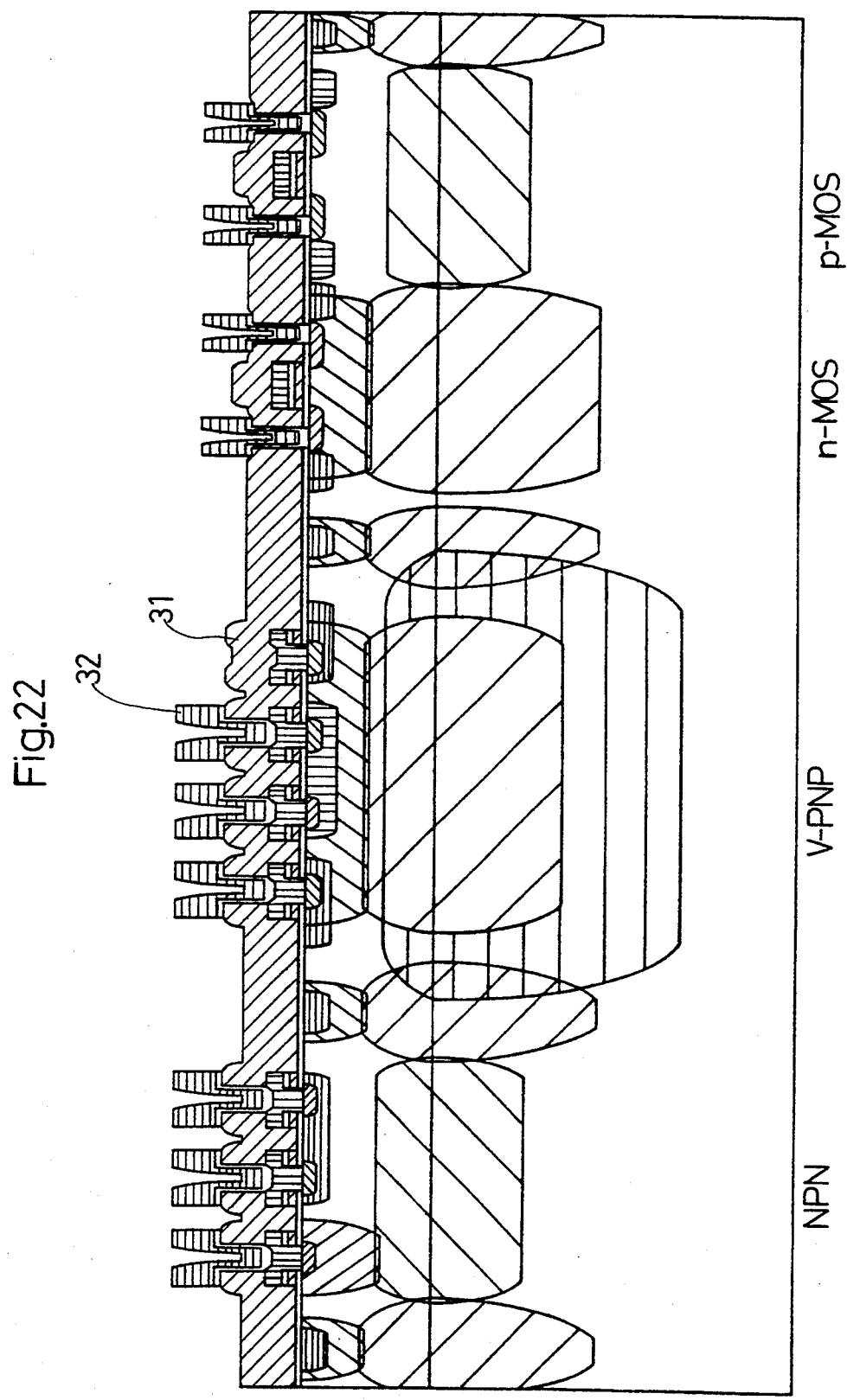
FIG. 22 is a section of the substrate to which the Al wiring is formed in the manufacturing process according to the sixth embodiment.
Figure 23:
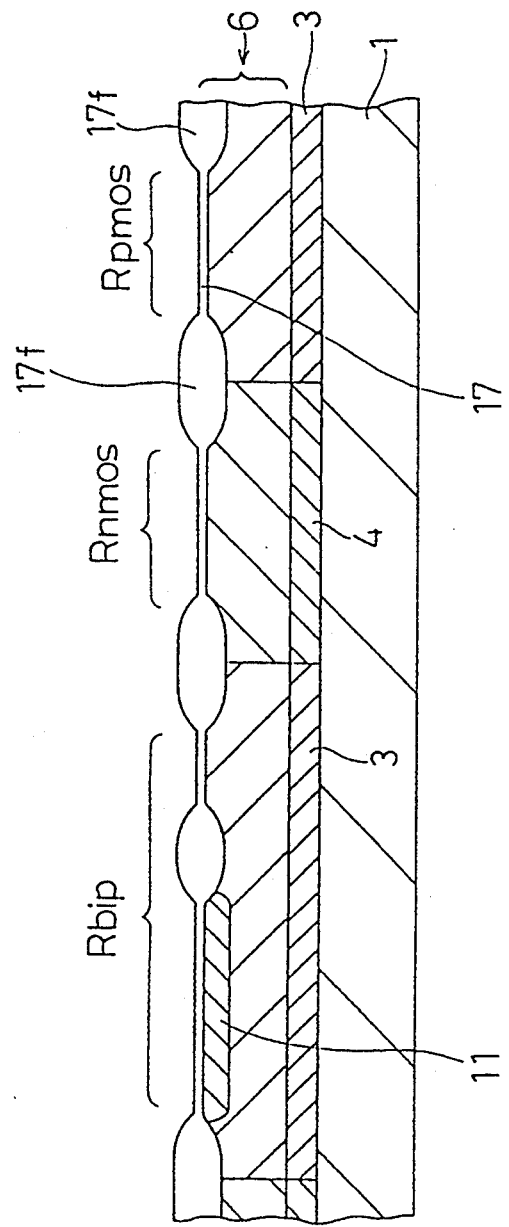
FIG. 23 is a section of the substrate to which a buried region and the silicon oxide film are formed in a conventional manufacturing process of a semiconductor device.
Figure 24:
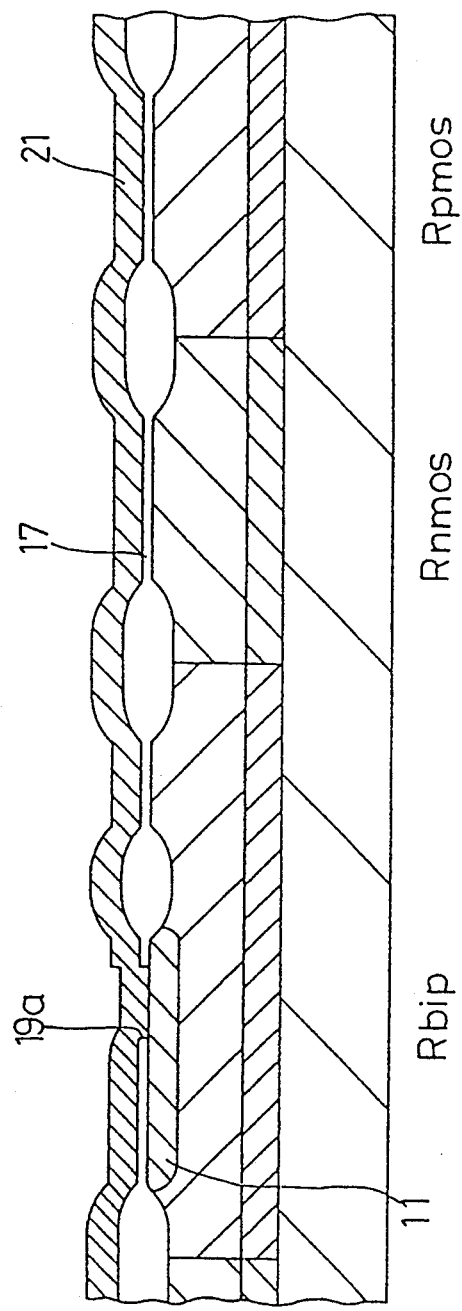
FIG. 24 is a section of the substrate to which the polysilicon film is formed in the conventional manufacturing process of a semiconductor device.
Figure 25:
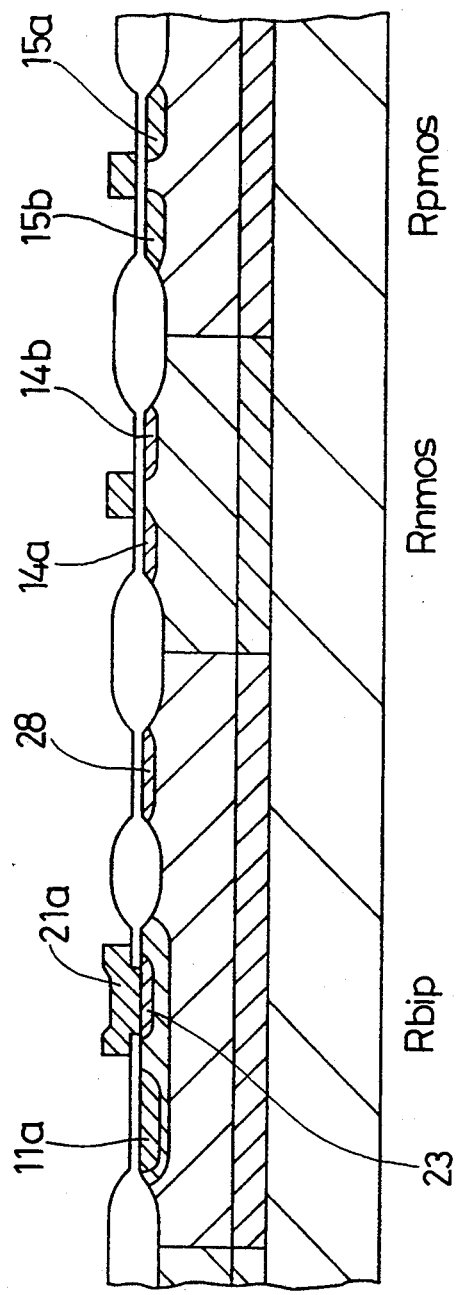
FIG. 25 is a section of the substrate to which the polysilicon electrode is formed in the conventional manufacturing process of a semiconductor device.

FIGS. 20–22 show the manufacturing steps of a semiconductor device in the sixth embodiment, wherein the step in FIG. 20 is carried out after the steps in FIGS. 1 and 2 in the first embodiment.

After the N+ type diffusion layer 9 to be the collector wall region of the vertical NPN transistor shown in FIG. 2 is formed, as shown in FIG. 20, the boron ions are implanted and the heat treatment is conducted in the same manner as in FIG. 3 to form the P− type active base layer 11, the P− type diffusion layer 16, the P− type channel stopper 13a and the P− type isolating diffusion layer 13b. Then, the phosphorus ions are implanted in the same manner as in FIG. 2 to form the N− type active base layer 12 and the N− type channel stopper 10.

Next, immediately after the silicon oxide film 17a is Formed, a thick polysilicon film 22 of, for example, 50 nm thickness serving as the protection film and to be a floating gate electrode is laid on the silicon oxide film 17a according to the low pressure CVD method. Then, the dry-oxidization at 900° C. is conducted for 30 minutes, the silicon oxide film 17b for insulating the gate electrode from the floating gate electrode is formed on the polysilicon film 22, and the arsenic ions are implanted into the polysilicon film 22 under conditions of 60 keV and $1 \times 10^{16}$ cm$^{-2}$ for making the polysilicon film 22 a floating gate electrode.

Next, using the resist as a mask, the polysilicon film 22 and the silicon oxide films 17a, 17b at the vertical NPN translator and the vertical PNP transistor are dry-etched to form each contact hole 19a–19c of the vertical NPN transistor and the vertical PNP transistor.

Then, as shown in FIG. 21, the polysilicon film 21 of 300 nm thickness is formed according to the low pressure CVD method and dry-etched using the resist as a mask to form each electrode 21a–21c of the vertical NPN transistor and the vertical PNP transistor and each gate electrode 21f of the N-channel type MOS transistor and the P-channel type MOS transistor. At this time, each silicon oxide film 17a, 17b and the polysilicon film 22 are patterned concurrently to form a floating gate electrode 22a.

Further, the N+ base contact 27, the N+ collector contact 25, the N+ emitter layer 23, the N+ source 14c, the N+ drain 14d, the P+ base contact 24, the P+ collector contact 28, the P+ emitter layer 26, the P+ source 15c and the P+ drain 15d are formed in the same manner as in FIG. 12.

Then, as shown in FIG. 22, the NSG film 31 and the Al wiring 32 are formed as well as in the first embodiment (in FIG. 7).

In the sixth embodiment, though an FAMOS transistor is used instead of the MOS transistor and composition of the isolating insulator film between the emitter electrode and the base diffusion layer of the bipolar transistor are different from that in the third embodiment, the basic structure is identical with that in the third embodiment. Thus, the same effects as in the third embodiment are obtained.

In addition, the polysilicon film 22 for the floating gate electrode which is the protection film is formed on the silicon oxide film 17a which is the dielectric film, and each contact hole 19a–19c of the bipolar transistor is formed as well as in the third embodiment after the formation of the silicon oxide film 17b for insulating the floating gate electrode from the gate electrode. Thus, the bipolar transistor and the FAMOS transistor as a non volatile memory are manufactured at the same time without increase in the numbers of masks and steps for manufacturing the bipolar transistor.

Moreover, the structure of the isolation insulator film between the base diffusion layer and the emitter electrode of the bipolar transistor is different from that in the third embodiment, and an effective thickness of the insulator film is thicker than that in the third embodiment. Therefore, the parasitic amount between the emitter and the base is reduced, and more excellent, high-speed, less dissipation bipolar transistor is manufactured.

Modified examples of each embodiment are described below.

In the first embodiment, with the silicon nitride film 18A as the protection film, the gate insulator film is of two-layer film of the silicon oxide film 17 and the silicon nitride film 18A, that is, an ON film. The protection film may be the two-layer film of the silicon nitride film and the silicon oxide film so that the gate insulator film is of three-layer film (ONO film).

In second and third embodiments, by using the silicon oxide film 17 as the dielectric film, the gate insulator film is of single-layer film. The dielectric film may be a multiple-layer film such as the ON film or the ONO film. Such a modification may be applied to the fourth embodiment.

In first to sixth embodiments, the gate insulator film necessarily includes the silicon oxide film (silicon oxide films 17, 17a). The silicon oxide film may be exchanged to the silicon nitride film.

Further, a silicide film such as TiSi$_2$, MoSi$_2$ may be used as the protection film and/or dielectric film.

In first to sixth embodiments, before the silicon oxide film 17 is formed, the P$^-$ type active base layer 11 to be the base region of the vertical NPN transistor, the P$^-$ type diffusion layer 16 to be the collector wall region of the vertical PNP transistor, the P$^-$ type channel stopper 13a to be the channel stopper of the N-channel type MOS transistor, the P$^-$ type diffusion layers 15a, 15b to be respectively the source and the drain of the P-channel type MOS transistor, the P$^-$ type isolating diffusion layer 13b to be a part of the element isolating region, the N$^-$ type active base layer 12 to be the base region of the vertical PNP transistor, the N$^-$ type channel stopper 10 to be the channel stopper of the P-channel type MOS transistor, the N$^-$ type diffusion layers 14a, 14b to be respectively the source and the drain of the N-channel type MOS transistor, and the like are formed. However, the order of the steps is not limited to each embodiment. They may be formed after the silicon oxide film 17 (or 17a) and the silicon nitride film 18A to be the gate insulator film are formed. Or they may be formed utilizing the diffusions from the electrode and in a part of the silicon subsurface substrate after the electrode is formed.

In third to sixth embodiments, source and drain regions are respectively of single-source and single-drain structures formed with the gate electrode as a self alignment mask. The source region and the drain region may be of LDD structure, DDD structure, or the like. In this case, it is possible to form lightly doped regions of the source and the drain of the MOS transistor at the same time as the formation of the P$^-$ type active base region and the N$^-$ type active base region of the bipolar transistor.

In the sixth embodiment, the bipolar transistor and the FAMOS transistor are manufactured at the same time, and an ordinary MOS transistor is not manufactured. However, it is possible to manufacture also the ordinary MOS transistor concurrently only by removing the silicon oxide film 17b in a region where the ordinary MOS transistor is to be formed, using the resist as a mask during the time until each contact hole 19a–19c of the bipolar transistor is formed after the silicon oxide film 17b for insulating the floating gate electrode from the gate electrode is formed in FIG. 20.

We claim:

1. A semiconductor device in which a MIS transistor and a bipolar transistor are arranged on a semiconductor substrate, comprising:
   a) the MIS transistor having:
      a dielectric film formed on the semiconductor substrate and serving as a gate insulator film;
      a protection film made of an insulating material formed on the dielectric film for protecting the dielectric film by barring contamination matters from passing therethrough and serving as a gate insulator film together with the dielectric film; and a conductive film formed on the protection film and serving as a gate electrode; and b) the bipolar transistor having;

a dielectric film and a protection film respectively formed at least on one of active regions of an emitter, a base and a collector of the semiconductor substrate, and respectively made of a same material as the dielectric film and the protection film of the MIS transistor;

a contact hole made by opening the dielectric film and the protection film at the upper part of the active region of the semiconductor substrate; and an electrode formed so as to cover at least a part of the protection film and an exposing face of the contact hole, and contacting to the active region, wherein the dielectric film of the MIS transistor and the dielectric film of the bipolar transistor have the same thickness and the protection film of the MIS transistor and the protection film of the bipolar transistor have the same thickness.

2. The semiconductor device according to claim 1, wherein the dielectric film is a silicon oxide film, and the protection film is a silicon nitride film.

3. The semiconductor device according to claim 1 or 2, wherein the dielectric film is a very thin silicon oxide film, and a region around a boundary of the protection film and the dielectric film serves as a non volatile memory.

4. The semiconductor device according to claim 1, wherein at least one of the protection film and the dielectric film is a multiple-layer film.

* * * * *